United States Patent
Elce et al.

(10) Patent No.: US 7,378,456 B2
(45) Date of Patent: May 27, 2008

(54) DIRECTLY PHOTODEFINABLE POLYMER COMPOSITIONS AND METHODS THEREOF

(75) Inventors: Edmund Elce, Lakewood, OH (US); Ramakrishna Ravikiran, Strongsville, OH (US); Larry F. Rhodes, Silver Lake, OH (US); Robert Shick, Strongsville, OH (US); Saikumar Jayaraman, Chandler, AZ (US)

(73) Assignee: Promerus LLC, Brecksville, OH (US)

( * ) Notice: Subject to any disclaimer, the term of this patent is extended or adjusted under 35 U.S.C. 154(b) by 360 days.

(21) Appl. No.: 11/044,484

(22) Filed: Jan. 27, 2005

(65) Prior Publication Data

US 2005/0186502 A1  Aug. 25, 2005

Related U.S. Application Data

(60) Provisional application No. 60/540,619, filed on Jan. 30, 2004.

(51) Int. Cl.
*C08J 3/28* (2006.01)
*G03C 1/73* (2006.01)
*C08F 236/20* (2006.01)

(52) U.S. Cl. ............ 522/153; 522/154; 430/287.1; 252/182.24; 526/279

(58) Field of Classification Search ........... 522/153, 522/154; 430/287.1; 252/182.24; 526/279
See application file for complete search history.

(56) References Cited

U.S. PATENT DOCUMENTS

| | | | | |
|---|---|---|---|---|
| 5,912,313 A | * | 6/1999 | McIntosh et al. | 526/279 |
| 5,953,627 A | * | 9/1999 | Carter et al. | 438/623 |
| 6,121,340 A | * | 9/2000 | Shick et al. | 522/31 |
| 2002/0052454 A1 | | 5/2002 | Lipian et al. | |
| 2002/0103317 A1 | | 8/2002 | Zhao et al. | |
| 2002/0164547 A1 | | 11/2002 | Ferm et al. | |
| 2004/0068075 A1 | * | 4/2004 | Lichtenhan et al. | 528/15 |

* cited by examiner

*Primary Examiner*—Fred M Teskin
(74) *Attorney, Agent, or Firm*—Bernard Berman

(57) ABSTRACT

The present invention relates to a directly photoimageable polymer composition (DPPC) and methods for its use in forming microelectronic and optoelectronic devices. Such DPPC encompasses a polymer having at least one norbornene-type repeat unit having a pendant silyl containing radical and at least one norbornene-type repeat unit having an acrylate containing radical.

7 Claims, 4 Drawing Sheets

DIRECTLY PHOTODEFINABLE POLYMER COMPOSITIONS AND METHODS THEREOF

CROSS-REFERENCE TO RELATED APPLICATIONS

This application claims the benefit of priority under 35 U.S.C. § 119 of U.S. Provisional Application Ser. No. 60/540,619 filed on Jan. 30, 2004.

TECHNICAL FIELD

The present invention relates generally to directly photodefinable polymer compositions and methods for making and using such compositions, and more specifically to directly photodefinable polymer compositions encompassing a norbornene repeat units, methods of making such polymer compositions and the use of such polymer compositions in microelectronic and optoelectronic applications.

BACKGROUND

The microelectronic and optoelectronic industries have been successful in stretching the useful life of materials and methods needed for the manufacture of micro and optoelectronic devices. However, as the complexity and the desired performance of such devices increases, such mature materials and methods are becoming more and more problematic. Therefore new materials and methods are the subject of ongoing research to meet the needs of future generations of such devices as well as to improve the yield and reduce the cost of current and future devices.

Polymeric materials of various compositions have been the focus of much of the aforementioned ongoing research. However, while some such polymeric materials have been met with some successes, these materials are often limited by their physical characteristics and the processing methods they require for their use. For example, polyimide materials have been used as interlayer dielectric materials in microelectronic devices such as integrated circuits (IC's) due to their having a dielectric constant that is lower than that of silicon dioxide. Also, such polyimide materials can serve as a planarization layer for IC's as they are generally applied in a liquid form, allowed to level, and subsequently cured. However, polyimide materials readily absorb moisture even after curing and this absorption can result in device failure. In addition, polyimides are generally not easily patterned as is often required in the manufacture of IC's and other microelectronic devices.

For optoelectronic devices, polymeric materials have been investigated as a replacement for glass optical fibers used in the manufacture of optical waveguides. Such polymeric materials are believed to hold great promise for constructing cost effective, reliable, passive and active integrated components capable of performing the required functions for integrated optics, that is to say optical devices integrated with electronic devices. For example, in U.S. Pat. No. 5,292,620, to Booth et al., waveguide structures having a predetermined geometry and a process for forming these structures using photolithographic techniques are disclosed. However, the materials disclosed in the '620 patent are acrylate type materials that have properties that are reported as making their processing difficult (see, U.S. patent application No. 20020164547 A1 to Ferm et. al.). In particular, it is disclosed that dissolved and gaseous oxygen present within or in the proximity of the photohardenable layer can quench polymerization and therefore its abundance must be carefully regulated, both within and at the immediate surface of the material. In addition, acrylate type materials, such as those of the '620 patent, are known to have relatively low glass transition temperatures which can be problematic where processing commonly used in the fabrication of microelectronic circuitry is required after waveguide fabrication.

Therefore it would be advantageous to provide polymeric materials that are useful for both microelectronic and optoelectronic devices, as well as appropriate methods for using such materials. In addition, it would be advantageous if such materials were in and of themselves photodefinable. That is to say, such materials could be patterned without the need of a distinct and separate patterning layer such as a photoresist material.

BRIEF DESCRIPTION OF THE DRAWINGS

Embodiments of the invention are described below with reference to the following accompanying drawings.

DETAILED DESCRIPTION

Figure 1:
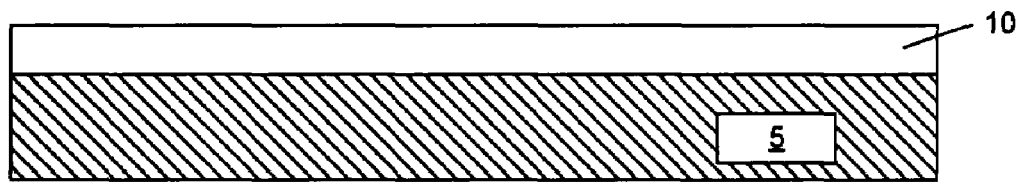
FIGS. 1, 2, 3 and 4 are schematic drawings that illustrate, in a simplified manner, a sequence of forming waveguide structures in accordance with an exemplary embodiment of the present invention.

Exemplary embodiments in accordance with the present invention will be described. Various modifications, adaptations or variations of such exemplary embodiments described herein may become apparent to those skilled in the art as such are disclosed. For example, two or more polycyclic polymer compositions can be blended with one another in an appropriate ratio to form other advantageous polymer compositions. It will be understood that all such modifications, adaptations or variations that rely upon the teachings of the present invention, and through which these teachings have advanced the art, are considered to be within the scope and spirit of the present invention.

As stated herein, the terms "polycycloolefin," "polycyclic," and "norbornene-type" are used interchangeably herein to mean a monomer material that contains at least one norbornene moiety in accordance with Structure 1 shown below, or a polymeric material that was formed from such a monomer and that has at least one repeat unit in accordance with Structure 2, also shown below:

1

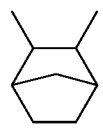

2

The terms "waveguide core" or "waveguide channel" are used interchangeably herein to refer to a portion of a polymeric film having a generally rectangular or square cross-sectional profile with the dimensions of such cross-sectional profile ranging from about 1 μm to about 200 μm in some embodiments, from about 5 μm to about 100 μm in other embodiments and from about 10 μm to about 60 μm in still other embodiments. Such waveguide core or channel is further characterized as having a first refractive index (RI) that is higher than a second refractive index of adjacent regions, structures or films. Such adjacent regions are referred to herein as clad regions, structures or films.

The term "mass polymerization" refers to a polymerization reaction which is generally carried out in the substantial absence of a solvent or solvents. The term "solution polymerization" refers to a polymerization reaction carried out in an excess of a solvent or solvents in which the reactive species and catalyst are dissolved.

The term "passivation layer" (PL) refers to a layer of dielectric material disposed over a microelectronic device. Such layer is typically patterned to form openings therein that provide for making electrical contact to the microelectronic device. Often a passivation layer is the last dielectric material disposed over the device and serves as a protective layer.

The term "interlayer dielectric layer" (ILD) refers to a layer of dielectric material disposed over a first pattern of conductive traces and between such first pattern and a second pattern of conductive traces. Such ILD layer is typically patterned to form openings therein (generally referred to as "vias") to provide for electrical contact between the first and second patterns of conductive traces in specific regions. Other regions of such ILD layer are devoid of vias and thus prevent electrical contact between the conductive traces of the first and second patterns in such other regions.

Turning first to FIG. 1, a simplified cross-sectional drawing that shows a first optional step in a sequence of steps useful for forming a waveguide core in accordance with embodiments of the invention is depicted. As shown, a portion of a support substrate 5 has an optional first layer 10 disposed thereover.

Support substrate 5 encompasses a wafer formed of silicon or other semiconductor material, a glass or quartz substrate, or a substrate formed of, or encompassing, one of several polymeric materials, although substrates of other materials can also be used. One such polymeric material is polyethylene terephthalate (PET).

In accordance with embodiments of the present invention, optional first layer 10 is generally employed as a clad layer and has a first refractive index (RI) that is a function of the material selected to form layer 10. In some embodiments, first layer 10 will be formed of a polymer such as a terpolymer of 5-hexyl norbornene, 5-triethoxysilyl norbornene and bis(bicyclo[2.2.1]hept-5-en-2-ylmethoxy)dimethyl silane (as will be discussed more fully below). In other embodiments, layer 10 will be formed from other appropriate polymers (made either by mass polymerization or solution polymerization) having the desired physical characteristics, for example an appropriate first RI, while in still other embodiments, first layer 10 is omitted and substrate 5 serves as the clad layer.

Where first optional layer 10 is employed, any appropriate method of applying such layer to substrate 5 can be used. Such methods include, but are not limited to, spin coating, spray coating, curtain coating, meniscus coating, roller coating and spreading the polymer material of such layer with a doctor blade. It will be understood that the specific method used for applying material to substrate 5 to form first layer 10 is a function of several factors that can vary from one use to another, hence such method is selected based on these several factors. Generally after the application of layer 10, such layer is allowed a period of time to level itself, that is to allow any non-uniformity induced by or during the application process to smooth out and essentially disappear. After leveling, layer 10 is heated to a temperature sufficiently high and for a time period sufficiently long to either remove any solvents that may be have been needed for the application method selected and/or to ensure complete curing of the monomers depending upon whether the formulation consists of a solution polymer or mass polymerizable components. Appropriate temperatures and time periods will be understood to be a function of the specific solvent(s) used and/or mass polymerization system used and thus selected to allow such solvent(s) to be removed or the formulation to be completely cured without significantly disturbing such leveled layer.

Figure 2:
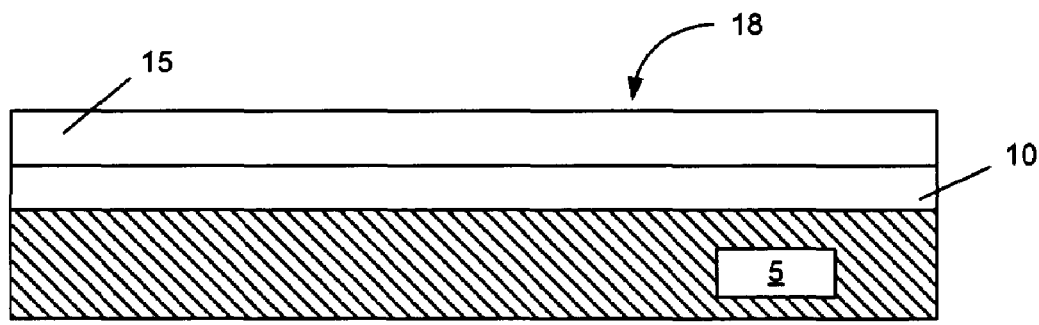

In FIG. 2 a second layer 15 of a directly photodefinable polymer composition (DPPC), in accordance with embodiments of the present invention, is shown disposed over the surface of optional first layer 10. The DPPC encompasses a norbornene-type polymer formed from at least a first and a second norbornene-type repeat unit, where at least one type of such repeat units encompasses a cross-linkable pendant group. In addition, the DPPC encompasses a photoinitiator and generally a solvent. For example in some embodiments, the norbornene-type polymer of the DPPC encompasses repeat units derived from hexyl norbornene, cyclol acrylate (norbornene methyl acrylate) (CANB) and diphenyl methyl (norbornene methoxy) silane, such as will be described more fully hereinafter. In addition to the norbornene-type polymer, photoinitiator and solvent, the DPPC of some embodiments in accordance with the present invention, also encompass one or more of antioxidants, adhesion promoters, dissolution modifiers, leveling agents, wetting agents, cure accelerators and the like.

As was described for first layer 10, the DPPC is applied using any appropriate method. For example, any of the several methods mentioned with respect to the application of first layer 10 can be used to apply layer 15. After application, such layer is allowed to level itself to form an essentially uniform upper surface 18. Once leveled layer 15, in a manner essentially analogous to that described for layer 10, is heated to a temperature sufficiently high and for a time period sufficiently long to remove essentially all of any solvent initially present in the DPPC. Such appropriate temperatures and time periods will again be understood to be a function of the specific solvent(s) used and thus selected to allow such solvent(s) to be removed without disturbing the uniform surface of layer 15. In addition, the temperature and time period selected will have essentially no deleterious effect on the activity of any additive(s) as may be present.

Figure 3:
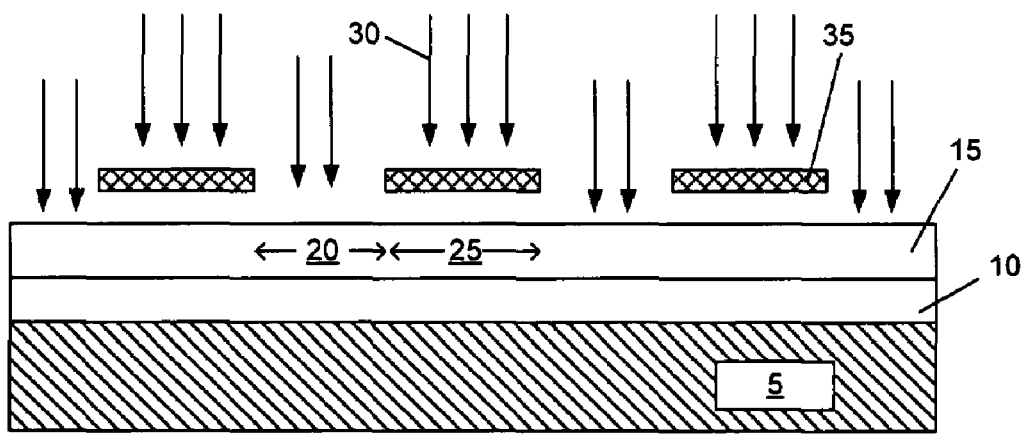

Turning now to FIG. 3, first regions 20 of second layer 15 are shown being exposed to actinic radiation 30 through a masking element 35. The source of actinic radiation 30 is selected based on the sensitivity of the photoinitiator used in the formulation of the DPPC employed. Thus, where a photoinitiator sensitive to ultra violet (UV) radiation is employed, a radiation source (not shown) that provides UV radiation of sufficient energy at an appropriate wavelength(s) to cause the decomposition of the photoinitiator is selected. It will be understood that the decomposition of the photoinitiator causes cross-linkable pendant groups present in some of the repeat units of the polymer to begin to crosslink with one another, both within a specific polymer chain, or between other cross-linkable groups of proximate polymer chains. Advantageously, second regions 25 are protected from radiation 30 by opaque portions of masking element 35 and are thus not exposed to radiation 30. As a result, the polymer within such unexposed regions 25 does not undergo such crosslinking. Hence, after exposure of regions 20, such second, unexposed regions 25 are readily removed using an appropriate solvent. This removal of regions 25 results in the formation of a pattern within second layer 15 that is a negative-tone image of masking elements 35.

This removing of regions 25 is generally referred to as development, and the solvent used is referred to as a developer. It will be understood that masking element 35 is shown having a simplified pattern for ease of understanding only and that actual embodiments of masking element 35 generally have more complex patterns as are used in the forming of optical devices such as splitters and the like.

Figure 4:
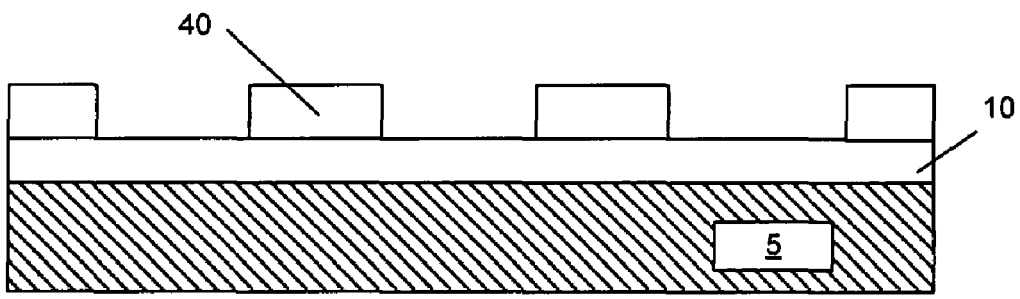

In FIG. 4, structures 40 shown are seen to be exposed regions 20 (FIG. 3) after the pattern of masking element 35 (FIG. 3) is developed over substrate 5. Generally after such a developing step, structures 40 are baked at a second temperature sufficient to remove any residual developer and to cause an essentially complete reaction (i.e., consumption) of any crosslinkable moieties left unreacted after being exposed to radiation 30 (FIG. 3). After this post develop bake, remaining structures 40 (of second film 15 depicted in FIG. 3) have a second RI, different than the first RI. Thus structures 40 are referred to as waveguide core or channel regions.

It will be understood that where it is disclosed that the second RI is higher than the first RI, or where it is described that the first RI is low and the second RI is high, such terminology does not refer to absolute values of a region's RI. Rather such terms are merely indicative of the relationship of the RI of the regions, structures or compositions to one another. In other words, where the second RI is said to be high, such a high refractive index is only considered as being high when compared to, for example, the first RI. Thus no reference to high or low values of RI, herein, should be interpreted as meaning anything other than a first value relative to a second value.

The polymers used in forming films 10 and 15, in accordance with the present invention, encompass repeat units within the polymer backbone that are the result of the polymerization of selected monomers as will be discussed hereinafter. Advantageously, it has been found that the RI of a norbornene-type polymer can be controlled by changing the nature or type of the pendant groups employed. Thus monomers that contain pendant groups having aromatic, Br or Cl moieties will tend to form polymers having a higher RI than monomers that contain pendant groups having alkyl, Si, F and/or ether moieties. In addition, where more than one type of monomer is used to form a polymer, if the feed ratio of the monomers is altered during the polymerization, the relative amounts of specific monomers incorporated into the resulting polymer is changed. It will be understood that such a change in the relative amounts of monomers can change the RI of that polymer in relation to a polymer formed from the same monomers, but with differing amounts of incorporation into the resulting polymer Hence, forming clad layer 10 having a lower RI than the RI of core layer 15, can be accomplished using identical monomers to form the polymer of each layer, but where the feed ratios of each polymer is appropriately different. It should also be understood that in some embodiments, clad layer 10 is advantageously formed using a DPPC and that such layer is photo defined. Where both clad layer 10 and core layer 15 are both formed from a DPPC, the structures of core layer 10 will have a first RI and the structures of core layer 15 will have a second RI, different from the first RI.

Figure 5:
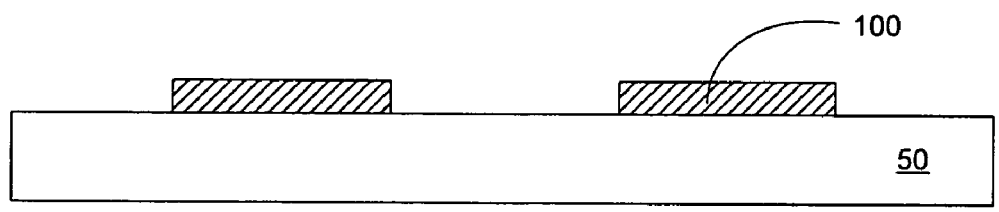
FIGS. 5, 6, 7 and 8 are schematic drawings that illustrate, in a simplified manner, a sequence of forming a passivation layer in accordance with another exemplary embodiment of the present invention.

Turning now to FIGS. 5 through 8, such are a sequence of schematic cross-sectional drawings that depict, in a simplified manner, forming a passivation layer in accordance with another embodiment of the present invention. Referring first to FIG. 5, a substrate 50 is shown having bonding pad structures 100 disposed thereon. It will be understood that structures 100 are simplified for ease of understanding only, and that actual bonding pad structures are formed in a manner appropriate to the type of underlying microelectronic device upon which they are disposed. Substrate 50 can be a silicon wafer, or any other appropriate substrate used for forming microelectronic devices, for example IC's. In other embodiments, substrate 50 can be a printed wire board or other substrate used for mounting and interconnecting microelectronic devices to one another, and/or to an external device. For example substrate 50 can encompass aluminum oxide, silicon carbide, PET or Kapton® (registered trademark of DuPont).

Bonding pad structures 100 are formed from an electrically conductive material such as copper, aluminum, any of the various alloys of copper and aluminum that are useful for electrical interconnection of microelectronic devices or any other appropriate conductive material. For example such other conductive materials include, but are not limited to gold, silver, nickel, titanium, tungsten, molybdenum and cobalt, alloys of such metals or fusible materials encompassing such metals. In some embodiments, structures 100 are conductively doped silicon or polysilicon.

Figure 6:
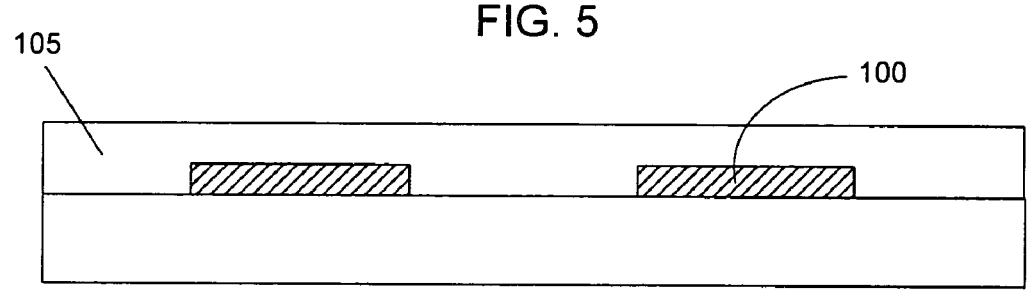

Referring to FIG. 6, a layer 105 of directly photodefinable polymer composition (DPPC) is shown disposed over substrate 50 and bonding pad structures 100. Any appropriate coating method, such as those discussed briefly above with respect to the embodiment of FIGS. 1-4, may be used to apply layer 105 on substrate 50.

Figure 7:
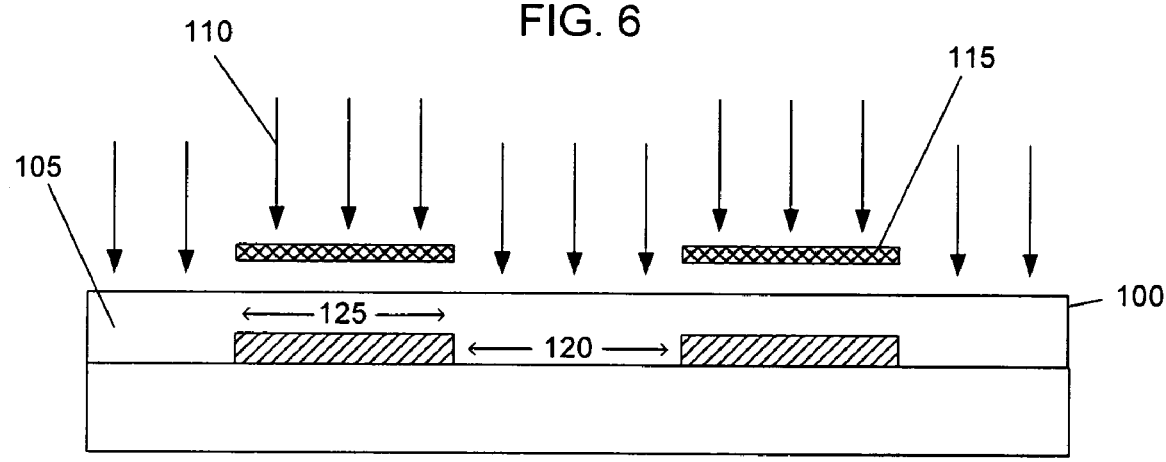

Next, in FIG. 7, portions of layer 105 are depicted being exposed to actinic radiation 110 through masking element 115. As shown, only regions 120 are exposed to actinic radiation 110 through masking element 115. Regions 125 are protected from such exposure by opaque portions of masking element 115. As discussed previously, the source of actinic radiation 110 is selected based on the sensitivity of the photoinitiator employed in the DPPC. Thus, a source for radiation 110 is selected to provide sufficient energy at the appropriate wavelengths to cause the photoinitiator of the DPPC to initiate crosslinking between cross-linkable pendant groups within and among the polymer chains as described previously. Advantageously, unexposed regions 125 are protected from radiation 110 by opaque portions of masking element 115 and crosslinking does not occur in such unexposed regions. Following exposure to radiation 110, a pattern can be developed by exposing layer 105 to a solvent (developer) which removes unexposed regions 125 in a manner analogous to that previously described.

It will also be understood that while masking element 115 is depicted as only having three openings for allowing radiation 110 to pass through to regions 120, such a depiction is simplified for ease of understanding only and that masking element 115 can be provided having a variety of more complex patterns and/or with many more openings than depicted.

Figure 8:
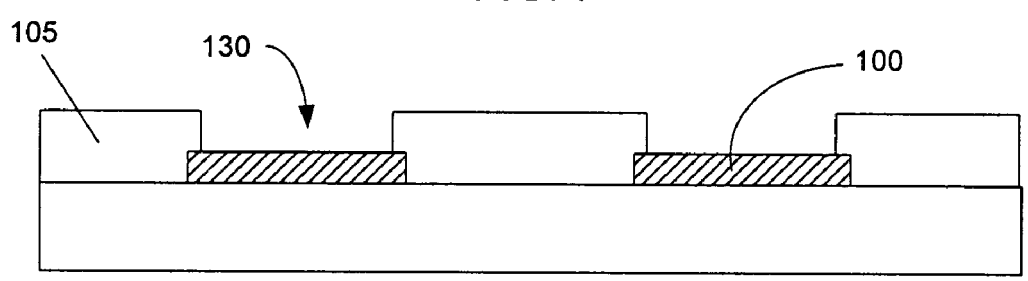

Turning now to FIG. 8, the structures of FIG. 7 are shown following developing a pattern of layer 105 and removal of uncrosslinked areas in unexposed regions 125 to expose bonding pad structures 100 through bonding pad openings 130. While not shown, it will be appreciated that electrical interconnection to bonding pad structures 100 through bonding pad openings 130 can be made using any of a variety of methods. Exemplary methods include, but are not limited to, compression and gold ball wire bonds, tape automated bonding (TAB), various flip-chip bonding schemes, solder micro-welding and the like.

In some advantageous embodiments of the present invention, rather than as the passivation layer described above with reference to FIGS. 5-8, it is desirable to employ a DPPC as an interlayer dielectric layer. Thus, turning now to FIGS. 9-13, forming such an interlayer dielectric structure in accordance with a further embodiment of the present invention is shown.

Figure 9:
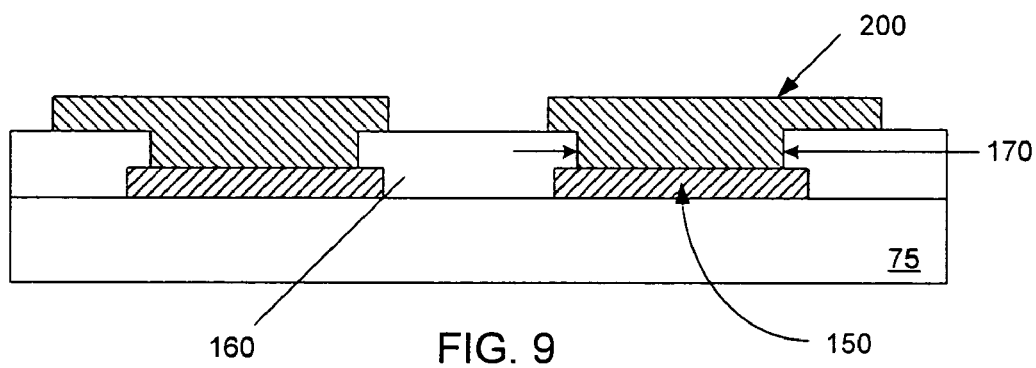
FIGS. 9, 10, 11, 12 and 13 are schematic drawings that illustrate, in a simplified manner, a sequence of forming an interlayer dielectric structure in accordance with a further embodiment of the present invention.

FIG. 9 depicts a substrate 75 having first conductive traces 150 and insulating layer 160 disposed thereon. Via structures 170 are shown formed within insulating layer 160 and second conductive traces 200 are shown applied within vias 170, to electrically contact first traces 150, and extend over portions of layer 160. It will be understood that the representation of FIG. 9 is simplified for ease of understanding only. Hence, other configurations of the elements of the structure depicted therein are of course possible. For example, in some embodiments of the present invention, second traces 200 encompass a first electrically conductive material disposed only within vias 170 and a second electrically conductive material disposed thereover (not shown).

Figure 10:
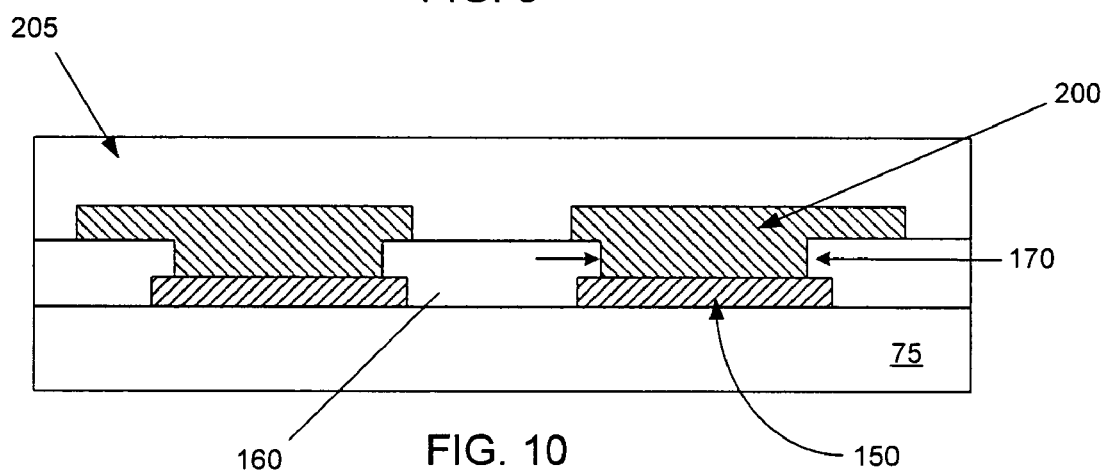

Referring now to FIG. 10, a layer 205 of directly photodefinable polymer composition (DPPC) is shown disposed over substrate 75, second conductive traces 200 and insulating layer 160. Layer 205 is applied using any appropriate coating method, such as those previously discussed with respect to the embodiments of FIGS. 1-4 and 5-8.

Figure 11:
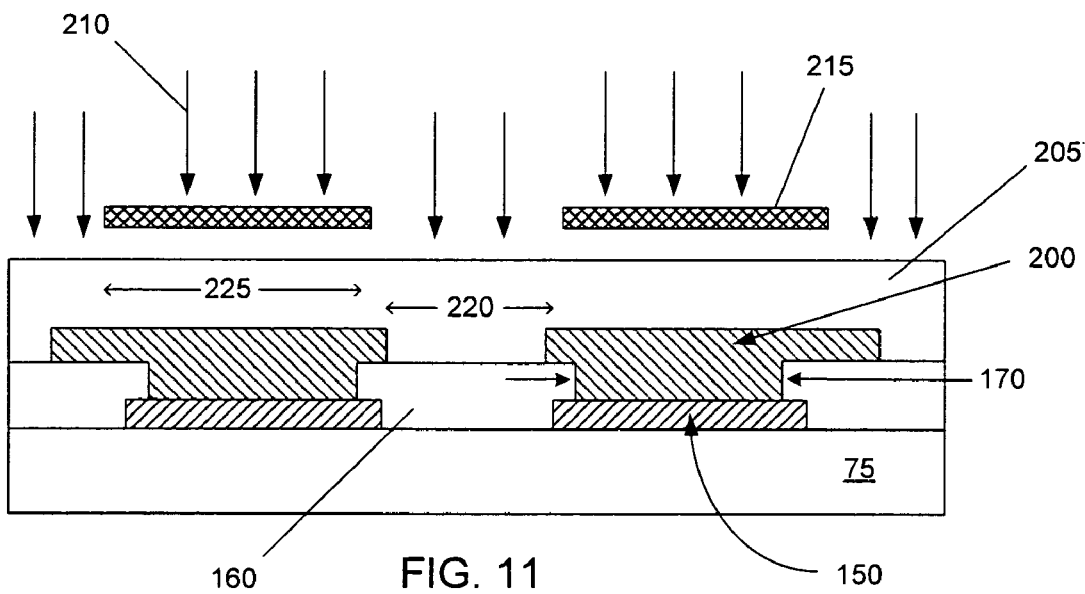

Following application of layer 205, such layer is exposed to actinic radiation 210 through masking element 215, as shown in FIG. 11. As depicted, only regions 220 are exposed to such radiation 210 through masking element 215. Regions 225 are protected from such exposure by opaque portions of masking element 215. As discussed above, the source (not shown) of actinic radiation 210 is selected based on the sensitivity of the photoinitiator incorporated within the DPPC. Thus, the radiation source is selected to provide sufficient energy at the appropriate wavelengths to cause the photoinitiator of the DPPC to initiate crosslinking between cross-linkable pendant groups within and among the polymer chains. Advantageously, unexposed regions 225 are protected from radiation 210 by opaque portions of masking element 215, as depicted, such that crosslinking does not occur in unexposed regions 225. Following exposure to radiation 210, a pattern can be formed by exposing layer 205 to a solvent (developer) which removes the material of unexposed regions 225.

Figure 12:
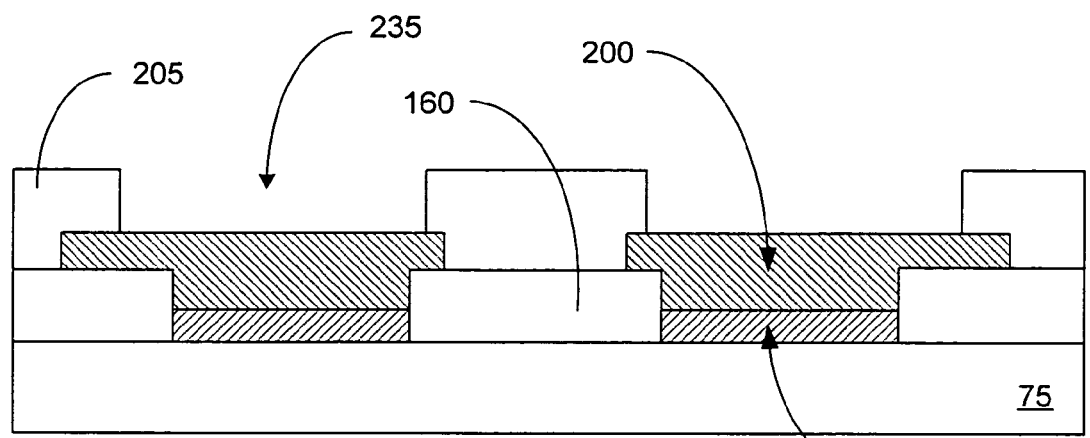

Turning to FIG. 12, the structure of FIG. 11 is shown following the patterning of layer 205 to remove uncrosslinked material from unexposed regions 225 (FIG. 11) thus forming second vias 235 and exposing portions of second traces 200.

Figure 13:
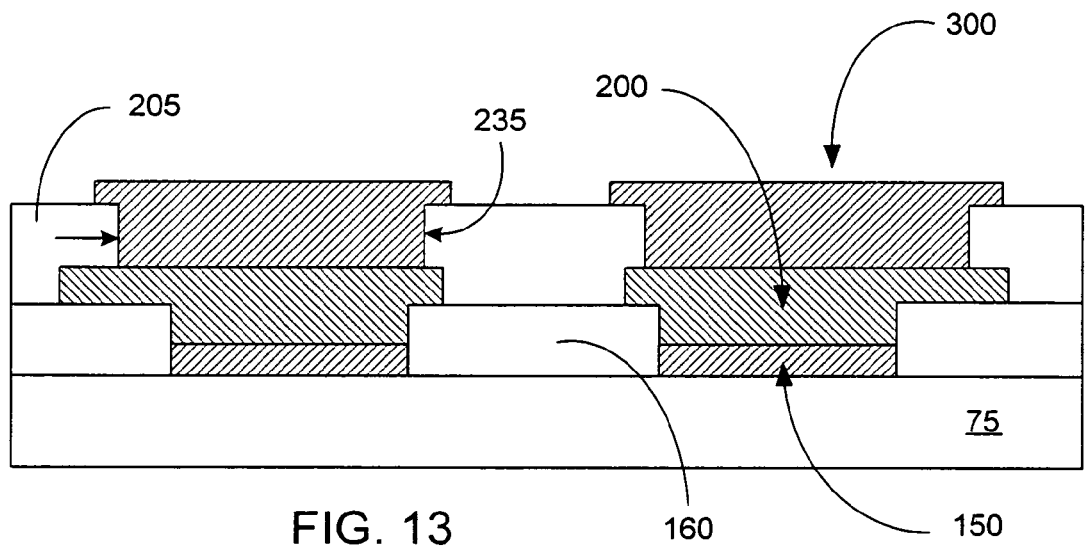

In FIG. 13, the structure of FIG. 12 is shown after third conductive traces 300 have been formed. It will be understood that the representation of FIG. 13 is simplified for ease of understanding only. Hence, other configurations of the elements of the structure depicted therein are of course possible. For example, in some embodiments of the present invention, third traces 300 encompass a first electrically conductive material disposed only within vias 235 and a second electrically conductive material disposed thereover (not shown). It will further be understood that embodiments in accordance with the present invention are not limited to structures having only a single ILD layer 205 but can encompass structures having multiple ILD layers. In addition, some embodiments of the present invention encompass structures that are a combination of ILD layers such as depicted in FIGS. 9-13 and passivation layers such as depicted in FIGS. 5-8.

In the description of embodiments of the present invention depicted in FIGS. 1-4, it was pointed out that the refractive index of the DPPC could be controlled through the selection of specific monomers and/or the ratio of the amounts of specific monomers used to form the polymer encompassed therein. As it was further discussed, such control is needed to ensure that core structures have a higher RI than do clad structures, for example core structure 40 and optional clad layer 10 depicted in FIG. 4. Advantageously, it is well known that the refractive index of a material is related to the dielectric constant of such material by Maxwell's Relationship. Such relationship is expressed as $\kappa_e \cong n^2$ where n is the refractive index of the material and $\kappa_e$ is the dielectric constant of that material. Therefore, by controlling the RI of the polymer(s) used for forming passivation layer 105 (FIG. 6) and of ILD layer 205 (FIG. 10), the dielectric constant of such layers can also be controlled. It will be understood that this control is effected through the selection of the specific monomers used to form the polymer of the DPPC and/or the ratio of such monomers to one another within the polymer, as previously discussed. It will be realized that such control is valuable in the manufacture of microelectronic devices where, due to high operating frequencies and high device densities (as compared to devices of only a few years ago), passivation and ILD layers and/or structures having low dielectric constants are beneficial.

Monomers

At least a portion of the repeating units that form the backbone of polymers in accordance with embodiments of the present invention encompass pendant crosslinkable groups or moieties that have some degree of latency. That is to say that such groups do not crosslink at ambient conditions or during the initial forming of the polymers, but rather crosslink when such reactions are specifically initiated, for example by actinic radiation as described in the embodiments illustrated by FIGS. 1-13. Such latent crosslinkable groups are incorporated into the polymer backbone by providing, for example, norbornene-type monomers having such groups (as described below) to the polymerization reaction mixture.

Some polymers in accordance with embodiments of the invention encompass repeat units derived from monomers that include silyl functional pendant groups such as represented by Structure A below:

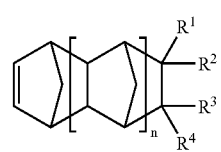

Structure A where n is an integer from 0 to 5. $R^1$, $R^2$, $R^3$ and $R^4$ independently represent hydrogen and where one of $R^1$-$R^4$ can be $-(CH_2)_x-Si(R^aR^bR^c)_3$, where x is an integer from 0 to 6, and $R^a$, $R^b$ and $R^c$ can independently be $C_1$-$C_4$ alkyl, $C_1$-$C_4$ alkoxy or halogen in any combination. In other embodiments, each of $R^a$, $R^b$, and $R^c$ are the same and are selected from methoxy, ethoxy, propoxy, butoxy, pentoxy groups or are chlorine.

Illustrative examples of monomers in accordance with Structure A include, but are not limited to, 5-triethoxysilyl-norbornene, 5-trichlorosilyl-norbornene, 5-trimethylsilyl norbornene, 5-chloro-dimethylsilyl norbornene, 5-trimethoxysilyl norbornene, 5-methyldimethoxysilyl norbornene and 5-dimethylmethoxysilyl norbornene.

In some embodiments of the present invention, the silyl containing pendant group of a norbornene-type monomer can incorporate multiple silicon atoms such as the exemplary POSS norbornene monomers (available from Hybrid Plastics of Hattiesburg, Miss.) designated as 1020NB, 1021 NB, 1022NB, 1034NB, 1035NB and 1038NB, respectively. Such POSS norbornene monomers have higher silicon content than the other silyl containing monomers discussed above. Exemplary POSS norbornene-type monomers are illustrated below:

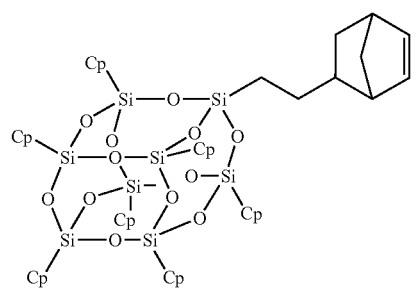

1020NB

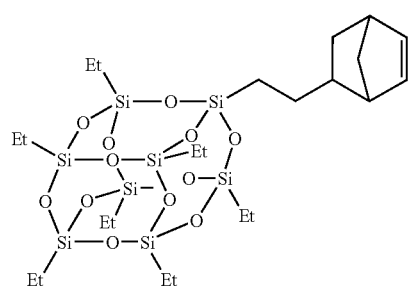

1021NB

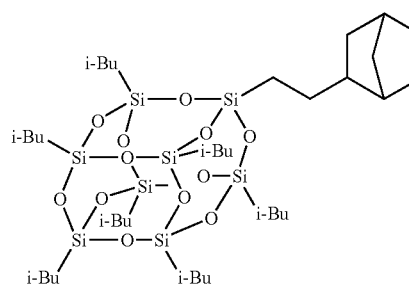

1022NB

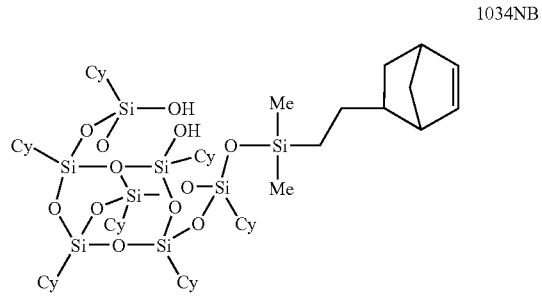

1034NB

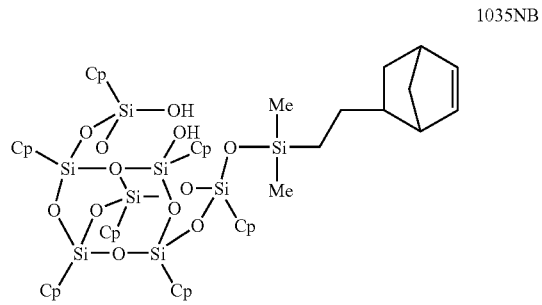

1035NB

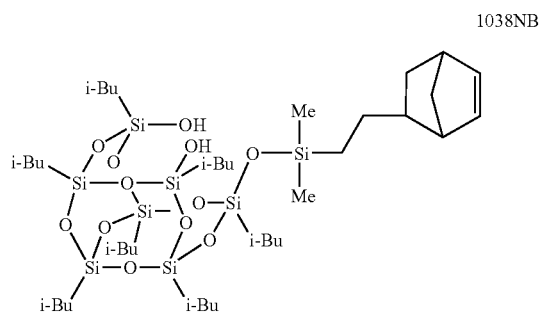

1038NB where Cp is cyclopentyl, i-Bu is iso-butyl, Et is ethyl, Cy is cyclohexyl and Me is methyl.

The inclusion of such POSS monomers in the forming of polymers in accordance with the present invention should result in polymers having advantageous properties. For example, a relatively low refractive index and dielectric constant, and relatively high glass transition temperatures (Tg), reduced moisture absorption and increased resistance to plasma etching conditions (for example as might be found in the manufacture of microelectronic devices), as compared to analogous polymers without such high silicon content repeat units.

Useful crosslinking monomers in accordance with an embodiment of the present invention are polycycloolefin monomers having a pendant acrylate-type group and are represented by Structure B:

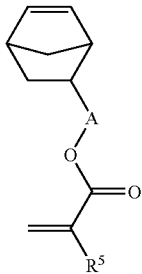

Structure B where $R^5$ represents hydrogen, a linear or branched $C_1$-$C_4$ hydrocarbon, a nitrile (CN), a $C_1$-$C_3$ perfluorocarbon, an aromatic, or a halogen (F, Cl, Br), and A represents a $C_1$-$C_3$ alkyl or $(CH_2)_q$—$(CR^eR^f)$—O—$(CH_2)_q$— where q independently represents an integer from 0 to 3 and $R^e$ and $R^f$ represent hydrogen, a $C_1$-$C_5$ alkyl, or a $C_1$-$C_3$ perfluorocarbon. Representative perfluorocarbons include, but are not limited to, trifluoromethyl and pentafluoroethyl. Representative aromatics include but are not limited to phenyl, biphenyl, and naphthyl.

Other representative crosslinkable monomers are represented by Structures B1-B7 shown below:

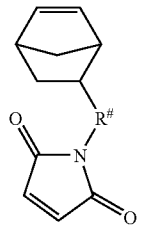

B1

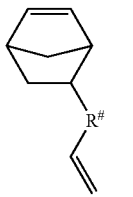

B2

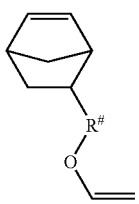

B3

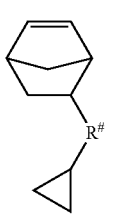

B4

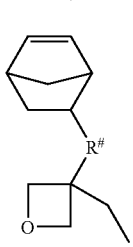

B5

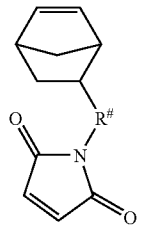

B6

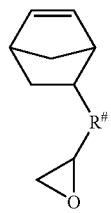

B7

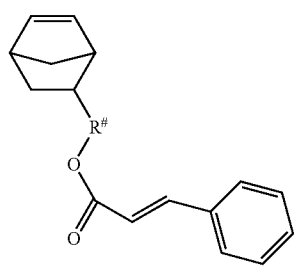

where $R^\#$, in some embodiments, is independently selected from either —$(CH_2)_n$- or $(CH_2)_n$—O—$(CH_2)_m$, where n is an integer from 1 to 4 and m an integer from 0 to 4; while in other embodiments $R^\#$ is $(CH_2)_m$—$Si(CH_3)_2$—O—$(CH_2)_p$ where m and p are independently integers from 0 to 4.

Norbornene-type monomers that are useful in embodiments in accordance with the present invention are also represented by Structure C below:

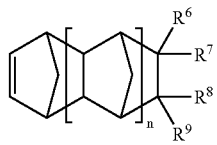

Structure C where $R^6$ to $R^9$ independently represent hydrogen, a hydrocarbyl or a functional substituent, and n is an integer from 0 to 5.

The hydrocarbyl substituent is a linear or branched ($C_1$-$C_{10}$) alkyl, a linear or branched ($C_2$-$C_{10}$) alkenyl, a linear or branched ($C_2$-$C_{10}$) alkynyl, a linear or branched ($C_5$-$C_{12}$) cycloalkyl, a ($C_6$-$C_{18}$) aryl, or a ($C_7$-$C_{24}$) aralkyl. One of $R^6$ or $R^7$ taken together with one of $R^8$ or $R^9$ and with the two ring carbon atoms to which they are attached can represent a saturated or unsaturated cyclic group containing 4 to 12 carbon atoms or an aryl group containing 6 to 14 carbon atoms. Representative alkyl groups include but are not limited to methyl, ethyl, propyl, isopropyl, butyl, isobutyl, sec-butyl, tert-butyl, pentyl, neopentyl, hexyl, heptyl, octyl, nonyl and decyl. Representative alkenyl groups include but are not limited to vinyl, allyl and propenyl. Representative alkynyl groups include but are not limited to ethynyl, 1-propynyl, 2-propynyl, 1-butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, and phenethyl. The term hydrocarbyl as used throughout the present specification is inclusive of halohydrocarbyl substituents. By halohydrocarbyl is meant that at least one hydrogen atom on the alkyl, alkenyl, alkynyl, cycloalky, aryl and aralkyl groups is replaced with a halogen atom selected from chlorine, bromine, fluorine and iodine. The degree of halogenation can range from at least one hydrogen atom being replaced by a halogen atom (e.g., a fuoromethyl group) to full halogenation (perhalogenation) wherein all hydrogen atoms on the hydrocarbyl group have been replaced by a halogen atom (e.g., trifluoromethyl or perfluoromethyl). Perhalohydrocarbyl groups as used herein include perhalogenated phenyl and alkyl groups.

Halogenated alkyl groups useful in embodiments of the present invention are partially or fully halogenated, linear or branched alkyl groups of the formula $C_zX_{2z+1}$ wherein X is independently a halogen or a hydrogen and z is selected from an integer of 1 to 20. In some embodiments each X is independently selected from hydrogen, chlorine, fluorine and/or bromine. In other embodiments each X is independently either hydrogen or fluorine.

In yet other embodiments, perfluorinated substituents include perfluorophenyl, perfluoromethyl, perfluoroethyl, perfluoropropyl, perfluorobutyl and perfluorohexyl. In addition to the halogen substituents, the cycloalkyl, aryl, and aralkyl groups of the invention can be further substituted with linear and branched ($C_1$-$C_5$) alkyl and haloalkyl groups, aryl groups, and cycloalkyl groups.

When pendant groups are functional substituents, any of $R^6$ to $R^9$ can independently be a radical selected from —(CH$_2$)$_m$—CH(CF$_3$)$_2$—O—CH$_2$—O—CH$_3$, —(CH$_2$)$_m$—CH(CF$_3$)$_2$—O—C(O)—O—C(CH$_3$)$_3$, (CH$_2$)$_m$—C(CF$_3$)$_2$—OH, (CH$_2$)$_m$—C(O)NH$_2$, (CH$_2$)$_m$—C(O)Cl, —(CH$_2$)$_m$—C(O)OR*, (CH$_2$)$_m$—OR, —(CH$_2$)$_m$—OC(O)R*, and —(CH$_2$)$_m$—C(O)R*, where m independently represents an integer from 0 to 10 and R* independently represents hydrogen, linear or branched ($C_1$-$C_{20}$) alkyl, linear or branched $C_1$-$C_{20}$ halogenated or perhalogenated alkyl, linear or branched ($C_2$-$C_{10}$) alkenyl, linear or branched ($C_2$-$C_{10}$) alkynyl, ($C_5$-$C_{12}$) cycloalkyl, ($C_6$-$C_{14}$) halogenated or perhalogenated aryl, and ($C_7$-$C_{24}$) aralkyl. Representative hydrocarbyl groups set forth under the definition of R* are the same as those identified above under the definition of $R^5$ to $R^9$. As set forth above under $R^6$ to $R^9$, the hydrocarbyl groups defined under R can be halogenated or perhalogenated. For example, when R* is $C_1$-$C_{20}$ halogenated or perhalogenated alkyl, R* can be represented by the formula $C_zX_{2z+1}$, wherein z is an integer from 1 to 20, at least one X on the alkyl group is a halogen, the remaining being independently a hydrogen or a halogen. Examples of perhalogenated alkyl groups include, but are not limited to, trifluoromethyl, trichloromethyl, —C$_7$ μl$_5$, and —C$_{11}$F$_{23}$. Examples of perhalogenated aryl groups include, but are not limited to, pentachlorophenyl and pentafluorophenyl.

Polymerization

The polymer compositions set forth herein can be prepared by addition polymerization in the presence of a single or multi-component Group VIII transition metal catalyst. Such multi-component catalysts are generally prepared in situ by combining a procatalyst with a cocatalyst (or activator) in the presence of the monomer(s) to be polymerized. By procatalyst is meant a Group VIII transition metal, generally palladium, containing compound that is converted to an active catalyst by a reaction with a cocatalyst or activator compound. The description and synthesis of representative procatalysts and cocatalysts, as well as cationic Pd(II) catalysts formed thereusing, are known. For example, as set forth in U.S. Pat. No. 6,455,650.

Palladium procatalysts suitable for the polymerization of the monomers of the present invention are represented by Formula I, below:

where $R^x$ is selected from isopropyl and cyclohexyl; and L' is selected from trifluoroacetate, and trifluoromethanesulfonate (triflate). Representative procatalyst compounds in accordance with such formula include, but are not limited to, (allyl)palladium-(tricyclohexylphosphine)triflate, (allyl)palladium(triisopropylphosphine)triflate, (allyl)-palladium(tricyclohexylphosphine)trifluoroacetate, and (allyl)palladium (triisopropyl-phosphine)trifluoroacetate.

Other suitable procatalysts are described in the aforementioned '650 patent and still others encompass a palladium metal cation and a weakly coordinating anion as represented by Formula II shown below:

where $E(R)_3$ represents a Group 15 neutral electron donor ligand where E is selected from a Group 15 element of the Periodic Table of the Elements, and R independently represents hydrogen (or one of its isotopes), or an anionic hydrocarbyl (and its deutero versions) containing moiety; Q is an anionic ligand selected from a carboxylate, thiocarboxylate, and dithiocarboxylate group; LB is a Lewis base; WCA represents a weakly coordinating anion; a represents an integer of 1 or 2; and b represents an integer of 1 or 2 where the sum of a+b is 3.

Representative cocatalyst compounds include, among others, lithium tetrakis(pentafluorophenyl)borate (LiFABA) and N,N-dimethylaniliniumtetrakis-(pentafluorophenyl)borate (DANFABA). Other suitable activator compounds are also described in the aforementioned '650 patent.

In accordance with some embodiments of the present invention, monomer to procatalyst to cocatalyst molar ratios can range from about 1,000:1:5 to about 20,000:1:5. In some embodiments, molar ratios are about 5,000:1:5. It should be recognized that appropriate molar ratios will vary depending, among other things, on the activity of a particular catalyst system, the reactivity of the monomer selected, and molecular weight of the resulting polymer that is desired.

Suitable polymerization solvents for the addition polymerization reactions include hydrocarbon and aromatic solvents. Exemplary hydrocarbon solvents include, but are not limited to, alkanes and/or cycloalkanes such as pentane, hexane, heptane and cyclohexane. Exemplary aromatic solvents include, but are not limited to, benzene, hexene, toluene, xylene and mesitylene. Other organic solvents such as diethyl ether, tetrahydrofuran, acetates (e.g., ethyl acetate), esters, lactones, ketones and amides are also useful. Mixtures of one or more of the aforementioned solvents can also be useful.

In some embodiments of the invention, the desired average molecular weight of the polymers is from about 50,000 to about 500,000. In other embodiments, the molecular weight is from about 100,000 to about 400,000. However, it should be understood that polymers of other average molecular weight ranges can be prepared and may be found useful. It will be noted that the aforementioned average molecular weights are measured using gel permeation chromatograph (GPC) with an appropriate standard. The resulting addition polymer can be a random copolymer or a mixture of various random copolymers and block copolymers.

Solution Polymerization Process

In a solution process, the polymerization reaction is carried out by adding a solution of the preformed catalyst or individual catalyst components to a solution of the norbornene-type monomer or mixtures of monomers to be polymerized. In some embodiments, the amount of monomer dissolved in the solvent ranges from about 5 to about 50 weight percent (wt %), and in other embodiments from about 10 to about 30 wt %, and in still other embodiments from about 10 to about 20 wt %. After the preformed catalyst or catalyst components are added to the monomer solution, the reaction medium is agitated (e.g. stirred) to ensure complete mixing of catalyst and monomer components and is generally heated for a period of time adequate for the polymerization.

Examples of solvents for the polymerization reaction include but are not limited to aliphatic (non-polar) hydrocarbons such as pentane, hexane, heptane, octane and cyclohexane; halogenated alkane solvents such as dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, and 1-chloropentane; esters such as ethylacetate, i-amylacetate; ethers such as THF, 1,4-dioxane, and diethylether; aromatic solvents such as benzene, xylene, toluene, mesitylene, chlorobenzene, and o-dichlorobenzene, Freon® 112 halocarbon solvent, or mixtures thereof. Desirable solvents include benzene, fluorobenzene, o-difluorobenzene, p-difluorobenzene, pentafluorobenzene, hexafluorobenzene, o-dichlorobenzene, chlorbenzene, toluene, o-, m-, and p-xylenes, cyclohexane, mesitylene, dichloromethane, 1,2-dichloroethane, and water.

Generally, the solvent represents from about 80 to about 90 percent of the reaction medium, although other amounts are also found suitable. While the reaction temperature of the polymerization reaction can range from about 0° C. to about 150° C., generally temperatures from about 10° C. to about 100° C., or even from about 20° C. to about 80° C. have been found to be advantageous.

Mass Polymerization

In a mass process, the polymerization reaction is generally carried out in the substantial absence of a solvent. In some cases, however, a small proportion of solvent can be present in the reaction medium. Small amounts of solvent can be conveyed to the reaction medium if it is desired to pre-dissolve the preformed catalyst or individual catalyst components in solvent before its/their addition to the monomer(s). Solvents also can be employed in the reaction medium to reduce the viscosity of the polymer at the termination of the polymerization reaction to facilitate the subsequent use and processing of the polymer. For example, in some embodiments in accordance with the present invention, solvent is employed to allow for spin coating a silicon wafer or other appropriate substrate. In one embodiment of the invention, the amount of solvent that can be present in the reaction medium ranges from about 0 to about 20 percent weight percent. In another embodiment, from about 0 to about 10 weight percent, and in still another embodiment from about 0 to about 1 weight percent, based on the weight of the monomer(s) present in the reaction mixture. Exemplary solvents include but are not limited to alkane and cycloalkane solvents such as pentane, hexane, heptane, and cyclohexane; halogenated alkane solvents such as dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro 2-methylpropane, and 1-chloropentane; aromatic solvents such as benzene, xylene, toluene, mesitylene, chlorobenzene, and o dichlorobenzene; and halocarbon solvents such as Freon® 112; and mixtures thereof.

Typically a mass polymerization reaction mixture is cured in a forced air oven at the following temperature conditions: 30 minutes at a temperature below 100° C. followed by 60 minutes at a temperature above 100° C. As an example, one typical condition for a curing a reaction mixture would be 30 minutes at 65° C. followed by 60 minutes at 150° C.

Photoinitiators

The directly photodefinable polymer compositions (DPPC) of the present invention encompass norbornene-type monomers having a pendant silyl group, a crosslinking norbornene-type monomer having a pendant acrylate group, a solvent, and a photoinitiator component. Any suitable photoinitiator can be employed so long as it induces the crosslinking and the subsequent curing of the polycyclic polymer. Free radical initiators have been found to be advantageous as photoinitiators for embodiments of the present invention. Exemplary free radical initiators include, among others, peroxides and peroxy compounds, including di-tertbutyl peroxide, diacetyl peroxide, dibenzyl peroxide and cumene hydroperoxide; benzoin derivatives, and ketoxime esters of benzoin, including benzoin n-butyl ether, benzoin isopropyl ether, deoxybenzoin, 2-oxo-1,2-diphenylethyl ester 2-nitro-benzeneacetic acid, 2-oxo-1,2-diphenylethyl ester-1-chloro-9,10-dihydro-9,10-dioxo-2-anthracenecarboxylic acid, 2-acetoxyl-1,2-diphenyl ethanone, 2-ethoxy-1,2-diphenyl ethanone, 2-n-propyloxy-1,2-diphenyl ethanone, 2-methoxy-1,2-diphenyl-1-propanone, 4-(diphenylphosphinyl)-2-methoxy-2-phenyl-butyrophenone; acetophenone derivatives, including diethoxyacetophenone, 1-phenyl-2-hydroxy-2-methyl propan-1-one; benzal ketals including 2,2-dimethoxy-2-phenylacetophenone, 2,2-diethoxy-2-phenyl-acetophenone, 2,2-di-n-propyl-2-phenylacetophenone, 2,2-bis(2-methoxyethoxy)-2-phenylacetophenone, 2,2-bis(2-chloroethoxy)-2-phenylacetophenone, 2,2-dimethoxy-2-(2-chlorophenyl)-2-chloroacetophenone; α-hydroxyalkylphenones and α-aminoalkylphenones; O-Acyl α-oximinoketones, including 1-phenyl-1,2-propanedione-2-O-benzyloxime, 1-phenyl-1,2-propanedione-2-(O-ethoxycarbonyl oxime); acylphosphine oxides and acylphosphonates; thiobenzoic S esters; azo compounds including Azobis(isobutyronitrile), diazirine, 3-acetoxy-3,5,5-trimethyl-1-pyrazoline, p-(n-pentyl) phenyl p-azidobenzenesulphonate, 2,2'-azobis(4-methoxy-2,4-dimethyl valeronitrile), 1,1'-azobis(cyclohexane-1-carbonitrile), 4-Azido-benzal-2-methoxy acetophenone; triazines; bisimidazoles; benzophenones; xanthones and thioxanthones; aromatic 1,2-diketones; phenylglyoxylates; ferrocenes; and transition metal carbonyls.

Generally, the photoinitiator component(s) is (are) employed in an amount ranging from about 0.5 to about 10 parts by weight of polymer. In some embodiments of the present invention, it has been found advantageous to include from about 1.5 to about 5.5 parts of photoinitiator by weight of polymer.

As described previously, the DPPC of the present invention can be first deposited onto a desired substrate as a coating from solution. The polymers can be cast as films using methods known to those skilled in the art, such as spin coating, dip coating, brush coating, roller coating, spray coating, solution casting, curtain coating, meniscus coating, and the like. Generally, spin coating is used due to its simplicity and the high uniformity of the resulting films.

For spin coating, the polymer is first isolated from the reaction medium and purified to remove residual monomer and spent catalyst system components. The purified polymer is then redissolved in an organic solvent. Suitable solvents include cyclohexanone, toluene, xylene, mesitylene, and decalin, with mesitylene being generally selected. In some embodiments in accordance with the present invention, the polymer solution has a solids content of from about 5 to about 65 wt % in solvent. In other embodiments, the solids content ranges from about 15 to about 45 wt %. Solution viscosities generally range from 500 to about 50,000 centipoise (cp) and are generally selected to provide a desired deposited thickness for the DPPC that will be employed. The photoinitiator and additives, such as photosensitizers, storage stabilizers, adhesion promoters and the like, are typically added to the polymer solution at this point to complete the forming of the DPPC.

The DPPC solution is then spin coated onto the desired substrate at spin speeds ranging from 200 to 5,000 revolutions per minute (rpm) for periods ranging from 20 to 200 seconds. The spin coating is generally performed in a two-step process in which a slower spin speed of about 500 rpm for about 10 seconds is initially utilized, followed by a higher spin speed of about 1000-3500 rpm for about 40-60 seconds. Generally, the films have a thickness of 0.2 to 50 microns, although thicker films, up to 500 microns, are possible when employing other coating techniques. The spun film is heated to an elevated temperature of about 90° C. to about 130° C. for a short period of time of about 1 to 10 minutes.

The resulting layer of the DPPC is then imaged through a photomask by electron beam or electromagnetic radiation such as x-ray, ultraviolet or visible radiation. Suitable radiation sources include mercury, mercury/xenon, mercury/halogen and xenon lamps, argon or xenon laser sources, x-ray or e-beam. Since the radiation is absorbed by the radiation-sensitive photoinitiator to cause crosslinking to begin, the specific radiation source selected is determined by the photoinitiator selected.

If desired, the film can be post exposure baked at a temperature of from about 90° C. to about 130° C. for a period of from about 1 to about 10 minutes.

The pattern in the polymer film is then developed by removing the unexposed regions of the film either by immersion, puddling or spraying with a suitable solvent for a short period of time, generally about 1 to 5 minutes. Suitable developers include but are not limited to toluene, xylene, mesitylene, decalin, and limonene.

Generally, the patterned layer is heated to a temperature of from about 90° C. to about 200° C. for a period of time, typically less than 1 hour, after develop to remove any residual solvents as may be present in the patterned layer as a result of the develop process, as well as to ensure completion of any cross-linking reactions.

It should be recognized that polymers useful for embodiments in accordance with the present invention are formed using at least one monomer in accordance with structure 1 and at least one monomer in accordance with structure 2. Additional norbornene-type monomers, for example in accordance with structure 3 can also be employed. Further it should be recognized that in addition to varying the selection of specific monomers for forming a polymer that is useful in a DPPC of the present invention, the relative ratios of such monomers selected can be varied to achieve specific characteristics for the final layer or structure. Such characteristics include, among others, refractive index, dielectric constant, glass transition temperature, plasma etch resistance, molecular weight and the like. Therefore the following examples are provided to describe exemplary methods of preparation and use of certain polymers and directly photo-imageable compositions of the present invention. Such examples are for illustrative purposes only and are not to be construed as limiting the scope and spirit of the present invention.

EXAMPLES

The following synthesis examples demonstrate the forming of norbornene-type polymers useful as directly photo-definable materials that can be used in accordance with embodiments of the present invention.

Example S1

Butyl Norbornene/Cyclol Acrylate Norbornene Copolymer

Butyl norbornene (BuNB, CAS 22094-81-1) (11.86 g, 0.08 mol), cyclol acrylate norbornene (CANB, CAS 95-39-6) (14.26 g, 0.08 mol), 1-hexene (1.50 g, 0.018 mol), lithium tetrakis(pentafluorophenyl)borate (Li FABA, CAS2797-28-6) (0.1394 g, 0.16 mmol) were combined in a dry 250 mL Wheaton Bottle with approximately 160 mL of toluene that had been previously degassed to remove any dissolved oxygen by passing a stream of nitrogen gas through the liquid for 30 minutes.

To this solution was added allyl palladium trinaphthylphosphine triflate (Pd 711 CAS 377077-16-2) (0.0681 g, 0.096 mmol) dissolved in dichloroethane (3 mL). After addition, the resulting mixture was maintained at 65° C. in an oil bath with stirring until gelled (18 hours). A 90 mL aliquot of toluene was added to dilute the viscous solution. The copolymer was precipitated into excess acetone (2.7 L). The resulting solid was recovered by filtration and dried in an oven at 75° C. under vacuum for 18 hours. After drying, 20.22 g of a light gray powder was obtained (77.4%). The molecular weight of the copolymer was determined by GPC in monochlorobenzene to be Mw=367,609 and Mn=75,517 daltons and Polydispersity Index=4.87. The composition of the copolymer was determined by $^1$H-NMR to be 58 mole % BuNB and 42 mole % CANB.

Example S2

BuNB/CANB Copolymer

S2 was prepared as above for S1, except that the amount of 1-hexene utilized was 8.98 g, 0.107 mol. After drying, 19.13 g (73.2%) of copolymer was obtained. The molecular weight of the copolymer was determined by GPC in monochlorobenzene to be Mw=141,835 and Mn=39,358 daltons and Polydispersity Index=3.60. The composition of the copolymer was determined by $^1$H-NMR to be 63 mole % BuNB and 37 mole % CANB.

Example S3

BuNB/CANB Copolymer

S3 was prepared as above for S1, except that the amounts of BuNB (18.68 g, 0.126 mol), CANB (9.36 g, 0.054 mol), 1-hexene (15.15 g, 0.18 mol), Li FABA (0.0784 g, 0.09 mmol) were combined in a 500 mL dry Wheaton bottle with 180 mL of degassed toluene. Pd 711(0.0128 g, 0.018 mmol) dissolved in dichloroethane was added and stirred for 22 hours. A 40 mL aliquot of toluene was added to dilute the viscous solution and the copolymer was precipitated into excess acetone. After drying, 22.35 g (78.9%) of copolymer was obtained. The molecular weight of the copolymer was determined by GPC in monochlorobenzene to be Mw=55,418 and Mn=12,122 and Polydispersity Index=4.57. The composition of the copolymer was determined by $^1$H-NMR to be 79 mole % BuNB and 21 mole % CAN B.

Example S4

BuNB/CANB Copolymer

S4 was prepared as above for S1, except that the amounts of BuNB (10.38 g, 0.07 mol), CANB (5.35 g, 0.03 mol), 1-hexene (0.842 g, 0.001 mol), Li FABA(0.0871 g, 0.10 mmol) were combined in a 250 mL dry Wheaton bottle with 82 mL of degassed toluene. Pd 711(0.014 g, 0.02 mmol) dissolved in dichloroethane (2 mL) was added and the resulting mixture heated and stirred until gelled. A 50 mL aliquot of toluene was added to dilute the viscous solution and the copolymer was precipitated into excess acetone. After drying, 14.65 g (93.1%) of copolymer was obtained. The molecular weight was determined by GPC in monochlorobenzene to be Mw=338,365 and Mn=76,727 daltons and Polydispersity Index=4.41. The composition of the copolymer was determined by $^1$H-NMR to be 75 mole % BuNB and 25 mole % CANB.

Example S5

BuNB/CANB Copolymer

S5 was prepared as above for S4, except that the amounts of BuNB (13.34 g, 0.09 mol), CANB (1.78 g, 0.01 mol), 1-hexene (1.68 g, 0.02 mol), Li FABA(0.0436 g, 0.05 mmol) were used. Pd 711(0.0071 g, 0.01 mmol) dissolved in dichloroethane (1 mL) was added and the resulting mixture heated and stirred until gelled. A 150 mL aliquot of toluene was added to dilute the viscous solution and the copolymer was precipitated into excess acetone. After drying, 14.96 g (95.1%) of copolymer was obtained. The molecular weight was determined by GPC in monochlorobenzene to be Mw=491,313 and Mn=93,510 daltons and Polydispersity Index=5.25. The composition of the copolymer was determined by $^1$H-NMR to be 91 mole % BuNB and 9 mole % CANB.

Example S6

BuNB/CANB Copolymer

S9 was prepared as in S5 except that the amounts of BuNB (2.08 g, 14.03 mmol), CANB (1.06 g, 5.95 mmol), 1-hexene (0.19 g, 0.0022 mol), Li FABA(0.0174 g, 0.02 mmol), and toluene(19 mL) were combined in a 50 mL dry Wheaton bottle. To this solution was added bis(tricyclohexyl phosphine) palladium diacetate (Pd 785, CAS 59840-38-9) (0.0032 g, 0.004 mMol) dissolved in toluene (1.0 mL) and the resulting mixture was heated with stirring until gelled. A 20 mL aliquot of toluene was added to dilute the viscous solution and the copolymer was precipitated into excess acetone. After drying, 2.45 g (78.03%) of copolymer was obtained. The molecular weight was determined by GPC in monochlorobenzene to be Mw=95,683 and Mn=33,339 daltons and Polydispersity Index=2.87. The composition of the copolymer was determined by $^1$H-NMR to be 74 mole % BuNB and 26 mole % CANB.

Example S7

BuNB/CANB Copolymer

S7 was prepared as in S6 except that the amount of Li FABA was (0.0087 g, 0.01 mmol), the amount of toluene was 19.5 mL and the amount of Pd 785 was (0.0016 g, 0.002 mmol) dissolved in 0.5 mL toluene. After drying, 1.71 g (54.5%) of a copolymer was obtained. The molecular weight was determined by GPC in monochlorobenzene to be Mw=73,567 and Mn=23,579 daltons and Polydispersity Index=3.12. The composition of the copolymer was determined by $^1$H-NMR to be 72 mole % BuNB and 28 mole % CANB.

Example S8

BuNB/CANB Copolymer

S8 was prepared as in S7 except that the amount Pd 785 was (0.0022 g, 0.004 mmol) dissolved in 1.0 mL toluene. The solution was processed as in S7 and after drying, 2.22 g (70.7%) of copolymer was obtained. The molecular weight was determined by GPC in monochlorobenzene to be Mw=99,104 and Mn=26,427 daltons and Polydispersity Index=3.75. The composition of the copolymer was determined by $^1$H-NMR to be 73 mole % BuNB and 27 mole % CANB.

Example S9

BuNB/CANB Copolymer

S9 was prepared as in S8 except that the amount of amount of Li FABA was (0.0087 g, 0.01 mmol) and the amount Pd 785 was (0.0011 g, 0.002 mmol) dissolved in 0.5 mL toluene. The solution was processed as in S8 and after drying, 1.61 g (51.3%) of copolymer was obtained. The molecular weight was determined by GPC in monochlorobenzene to be Mw=148,234 and Mn=35,462 daltons and Polydispersity Index=4.18. The composition of the copolymer was determined by $^1$H-NMR to be 65 mole % BuNB and 35 mole % CANB.

Example S10

Methyl Acetate Norbornene/CANB Copolymer

Methyl acetate norbornene (MeOAc NB, CAS 10471-2406) (2.99 g, 17.99 mmol), CANB (0.36 g, 2.02 mmol), 1-hexene (0.19 g, 0.0022 mol), DAN FABA (0.00321 g, 0.004 mmol) and anisole (14 mL) were combined in a dry 30 mL Wheaton bottle. The anisole was degassed to remove any dissolved oxygen by passing a stream of nitrogen gas through the liquid for 30 minutes. To this solution was added Pd 785 (0.0090 g, 0.004 mmol) dissolved in dichloroethane (0.5 mL). After addition, the solution was processed as in S9 and after drying, 3.21 g (95.8%) of copolymer was obtained. The molecular weight was determined by GPC in monochlorobenzene to be Mw=714,346 and Mn=89,454 daltons and Polydispersity Index=7.98. The composition of the copolymer was determined by $^1$H-NMR to be 91 mole % MeOAc NB and 9 mole % CANB.

Example S11

MeOAcNB/CANB Copolymer

S11 was prepared as in S10 except that (1.68 g 19.96 mol) of 1-hexene was utilized. After drying, 2.86 g (85.49%) of copolymer was obtained. The molecular weight was determined by GPC in monochlorobenzene to be Mw=69,724 and Mn=14,510 daltons and Polydispersity Index=4.80. The composition of the copolymer was determined by $^1$H-NMR to be 91 mole % MeOAc NB and 9 mole % CANB.

Example S12

MeOAcNB/CANB Copolymer

S12 was prepared as in S10 except that MeOAc NB (2.33 g, 14.02 mmol), CANB (1.07 g, 6.00 mmol), 1-hexene (0.19 g, 0.0022 mol), DAN FABA (0.00321 g, 0.004 mmol) were utilized. After drying, 3.18 g (93.5%) of copolymer was obtained. The molecular weight was determined by GPC in monochlorobenzene to be Mw=208,911 and Mn=57,738 daltons and Polydispersity Index=3.62. The composition of the copolymer was determined by $^1$H-NMR to be 70 mole % MeOAc NB and 30 mole % CANB.

Example S13

MeOAcNB/CANB Copolymer

S13 was prepared as in S12 except that 1.68 g (19.96 mmol) of 1-hexene was utilized. After drying, 2.89 g (85.0%) of copolymer was obtained. The molecular weight was determined by GPC in monochlorobenzene to be Mw=45,372 and Mn=16,084 daltons and Polydispersity Index=2.82. The composition of the copolymer was determined by $^1$H-NMR to be 70 mole % MeOAc NB and 30 mole % CANB.

Example S14

MeOAcNB/CANB Copolymer

S14 was prepared as in S10 except that MeOAcNB (1.66 g, 9.99 mmol), CANB (1.78 g, 9.99 mmol), 1-hexene (0.19 g, 0.0022 mol), DAN FABA (0.00321 g, 0.004 mmol) where utilized. After drying, 3.08 g (89.5%) of copolymer was obtained. The molecular weight was determined by GPC in monochlorobenzene to be Mw=196,247 and Mn=61,250 daltons and Polydispersity Index=3.20. The composition of the copolymer was determined by $^1$H-NMR to be 50 mole % MeOAc NB and 50 mole % CANB.

Example S15

MeOAcNB/CANB Copolymer

S15 was prepared as in S14 except that 1.68 g (19.96 mmol) of hexene was utilized. After drying, 2.79 g(81.1%) of copolymer was obtained. The molecular weight was determined by GPC in monochlorobenzene to be Mw=45,482 and Mn=16,241 daltons and Polydispersity Index=2.80. The composition of the copolymer was determined by $^1$H-NMR to be 50 mole % MeOAc NB and 50 mole % CANB.

Example S16

Bicyclo[2.2.1]hept-5-en-2-yl methoxy) methyl diphenyl-silane(DiPhNB)/CANB/Hexyl Norbornene(HxNB) Terpolymer DiPhNB (CAS 376634-34-3)(24.9 g, 77.8 mmol), CANB (18.47 g, 103.8 mmol), HxNB (60.0 g, 337.2 mmol), DAN FABA (0.208 g, 0.259 mmol), 1-hexene (4.36 g, 51.9 mmol) and degassed toluene (518.81 mL) (see, S1) were combined in a dry 1000 mL Wheaton bottle. To this solution was added bis(tri-naphthyl phosphine palladium di-acetate (Pd1049) (0.0261 g, 0.052 mmol) dissolved in dichloroethane (0.5 mL). After addition, the resulting mixture was maintained at 80° C. in an oil bath with stirring until gelled (5 hours). A 500 mL aliquot of tetrahydrofuran (THF) was added to dilute the viscous solution. The terpolymer was precipitated into excess methanol and the resulting solid recovered by filtration and dried in an oven at 70° C. under vacuum for 18 hours. After drying, 86.83 g (84.0%) of a white powder was obtained. The molecular weight of the terpolymer was determined by GPC in monochlorobenzene to be Mw=402,412 and Mn=62,746 daltons and Polydispersity Index=6.41. The composition was determined by $^1$H-NMR to be 15 mole % CANB, 60 mol % HxNB and 15 mol % DiPhNB.

Example S17

CANB/HxNB/Trimethoxysilyl norbornene (TMS NB) Terpolymer

TMS NB, (CAS 7538-46-7)(0.80 g, 3.74 mmol), CANB (0.667 g, 3.74 mmol), HxNB (2.0 g, 11.2 mmol), DAN FABA (0.0075 g, 0.0094 mmol), 1-hexene (0.314 g, 3.74 mmol) and degassed toluene (18.73 mL) were combined in a dry 1000 mL Wheaton bottle. Pd785 (0.00094 g, 0.0019 mmol) dissolved in dichloroethane (0.5 mL) was added and the resulting mixture was heated (see, S1) with stirring until gelled (5 hours, 20 min). A 60 mL aliquot of tetrahydrofuran (THF) was added to dilute the viscous solution and the copolymer was precipitated into excess methanol. The resulting solid was recovered by filtration and dried in an oven at 70° C. under vacuum for 18 hours. After drying, 1.7 g (49.0%) of terpolymer was obtained. The molecular weight of the terpolymer was determined by GPC in monochlorobenzene to be Mw=435,523 and Mn=239,130 daltons and Polydispersity Index=1.82. The composition r was determined by $^1$H-NMR to be 9 mole % CANB, 55 mol % HxNB and 36 mol % TMS NB.

Example S18

CANB/HxNB/Triethoxysilyl norbornene (TESNB) Terpolymer

S18 was prepared as in S17 except that 0.959 g(3.74 mmol) of TESNB (CAS 18401-43-9) was substituted for the TMS NB used in S17. Catalyst was added and the solution processed as in S17. After drying, 2.1 g (60.0%) of terpolymer was obtained. The molecular weight was determined by GPC in monochlorobenzene to be Mw=347,137 and Mn=167,181 daltons and Polydispersity Index=2.07. The composition was determined by $^1$H-NMR to be 9 mole % CANB, 58 mol % HxNB and 33 mol % TES NB.

Example S19

CANB/HxNB/DiPhNB Terpolymer

DiPhNB(12.3 g, 0.038 mmol), CANB (8.29 g, 0.05 mol), HxNB (29.0 g, 0.16 mmol), DAN FABA (0.135 g, 0.169 mmol), 1-hexene (6.26 g, 0.074 mmol) and degassed toluene (289.96 mL) were combined in a dry 1000 mL Wheaton bottle. To this solution was added tri-cyclohexyl phosphine palladium di-acetate (0.0152 g, 0.03 mmol) dissolved in dichloroethane (0.5 mL). After addition, the resulting mixture was maintained at 80° C. in an oil bath with stirring until gelled (3.5 hours). A 600 mL aliquot of tetrahydrofuran (THF) was added to dilute the viscous solution and the terpolymer was precipitated into excess methanol. The resulting solid was recovered by filtration and dried in an oven at 70° C. under vacuum for 18 hours. After drying, 35.0 g (70.0%) of terpolymer was obtained. The molecular weight was determined by GPC in monochlorobenzene to be Mw=386,369 and Mn=95,700 daltons and Polydispersity Index=4.04. The composition was determined by $^1$H-NMR to be 12 mole % CANB, 76 mol % HxNB and 12 mol % DiPhNB.

Example S20

DiPhNB/CANB Copolymer

DiPhNB (5.12 g, 16.8 mmol), CANB (0.72 g, 4.0 mmol), DAN FABA (0.0105 g, 0.0131 mmol), and degassed toluene (30 mL) were combined in a dry 50 mL Wheaton bottled. To this solution was added allyl palladium trinaphthyl phosphine trifluoroacetate (Pnap, CAS 377077-51) (0.0147 g, 0.022 mmol) dissolved in dichloroethane (5.0 mL). After addition, the resulting mixture was maintained at 80° C. in an oil bath with stirring until gelled (24 hours). A 25 mL aliquot of THF was added to dilute the viscous solution and the copolymer precipitated into excess methanol. The resulting solid was recovered by filtration and dried in an oven at 70° C. under vacuum for 18 hours. After drying, 2.71 g (46.4%) of copolymer was obtained. The molecular weight was determined by GPC in THF to be Mw=103,705 and Mn=31,011 daltons and Polydispersity Index=3.34. The composition of the copolymer was determined by $^1$H-NMR to be 19.1 mole % CANB, 80.9 mol % DiPhNB.

Example S21

TESNB/CANB Copolymer

TESNB (4.81 g, 18.8 mmol), CANB (0.72 g, 4.0 mmol), DAN FABA (0.0105 g, 0.0131 mmol), and degassed toluene (25 mL) were combined in a dry 50 mL Wheaton bottled. Catalyst was added and the solution processed as in S20. After drying, 4.22 g (76.5%) of copolymer was obtained. The molecular weight was determined by GPC in THF to be Mw=44,051 and Mn=14,001 daltons and Polydispersity Index=3.15. The composition of the copolymer was determined by $^1$H-NMR to be 8.7 mole % CANB, 91.3 mol % TESNB.

Example S22

DiPhNB/CANB Copolymer

DiPhNB (5.12 g, 16.8 mmol), CANB (0.71 g, 4.0 mmol), DAN FABA (0.0105 g, 0.0131 mmol), and degassed toluene (25 mL) were combined in a dry 50 mL Wheaton bottled. To this solution was added palladium (acetate) (acetonitrile) bis[tris(1-methylethyl)phosphine] tetrakis(pentafluorophenyl)borate (PAAiP FABA) (CAS 565226-51-9)(0.0263 g, 0.022 mmol) dissolved in dichloroethane (5.0 mL). The solution was processed as in S21. After drying, 4.68 g (80.3%) of copolymer was obtained. The molecular weight was determined by GPC in THF to be Mw=151,502 and Mn=24,498 daltons and Polydispersity Index=6.18. The composition of the copolymer was determined by $^1$H-NMR to be 19.2 mole % CANB, 79.2 mol % DiPhNB.

Synthesis Examples S23-S50 were carried out by combining appropriate amounts of monomers, 1-hexene, cocatalyst (LiFABA or DANFABA-4 equivalents with respect to catalyst) in a vial with an appropriate amount of degassed toluene (20 wt % monomer solution). The vial was then crimp capped and placed in a 65° C. oil bath. After 30 minutes, an appropriate amount of catalyst was added to the solution. The reaction was allowed to proceed for 16 hours and then the resulting polymer precipitated into excess acetone, filtered and dried in a 40° C. vacuum oven at for at least 12 hours and weighed.

The specific amount of each monomer used to form copolymers of Decyl NB and CANB (Examples S23-S45) is represented in Table 1, and for terpolymers of Decyl NB, CANB and TES NB (Examples 46-50) in Table 2 as a molar feed ratio. Also shown for each example is the catalyst used, where "pnap" represents allyl palladium trinaphthylphosphine triflate and "pcy" represents allyl palladium tricyclohexylphosphine triflate; catalyst concentration is represented in terms of its molar ratio to the sum of the amount of monomers (moles of monomer: moles of catalyst); and the concentration of 1-hexene is expressed with respect to the monomer mole %. In all the examples, LiFABA was used as a cocatalyst in a ratio of (4x with respect to the palladium catalyst concentration). Polymer yield is expressed as a percentage of the monomer used. Composition, Mw and Mn were determined as in Examples S1-S22.

TABLE 1

| Ex # | Molar Feed Ratio - DecylNB/CANB | Catalyst Identity | Catalyst Conc. | 1-Hexene Conc. | Polymer Yield (%) | Composition (DecylNB/CANB) | Mw ×10 E-3 | Mn ×10 E-3 |
|---|---|---|---|---|---|---|---|---|
| S23 | 90/10 | pnap | 20K:1 | none | 92.2 | 93.2/6.8 | 1500 | 740 |
| S24 | 90/10 | pnap | 20K:1 | 10 | 93.2 | 921.3/7.7 | 579 | 350 |
| S25 | 90/10 | pnap | 20K:1 | 20 | 91.5 | 91.7/8.3 | 415 | 222 |
| S26 | 90/10 | pnap | 20K:1 | 30 | 89.8 | 91.9/8.1 | 293 | 146 |
| S27 | 90/10 | pcy | 20K:1 | none | 68.8 | 95.2/4.8 | 1600 | 755 |
| S28 | 90/10 | pcy | 20K:1 | 20 | 82.8 | 94/6 | 430 | 191 |
| S29 | 90/10 | pcy | 20K:1 | 30 | 87.2 | 92.1/7.9 | 354 | 161 |
| S30 | 80/20 | pnap | 20K:1 | none | 75.3 | 88.4/11.6 | 847 | 648 |
| S31 | 80/20 | pnap | 20K:1 | 10 | 75.5 | 88.6/11.4 | 455 | 301 |
| S32 | 80/20 | pnap | 20K:1 | 20 | 82.5 | 93/7 | 430 | 319 |
| S33 | 80/20 | pnap | 20K:1 | 30 | 52.1 | 90.3/9.7 | 186 | 58 |
| S34 | 80/20 | pcy | 20K:1 | none | 46 | 89.2/10.8 | 781 | 344 |
| S35 | 80/20 | pcy | 20K:1 | 10 | 81.5 | 85/15 | 631 | 405 |
| S36 | 80/20 | pcy | 20K:1 | 20 | 80 | 83.3/16.7 | 527 | 347 |
| S37 | 80/20 | pcy | 20K:1 | 30 | 79.1 | 85.3/14.7 | 418 | 309 |
| S38 | 80/20 | pcy | 10K:1 | 20 | 81 | 85.7/14.3 | 141 | 64 |
| S39 | 70/30 | pcy | 20K:1 | none | 19.9 | 83.6/16.4 | 748 | 325 |
| S40 | 70/30 | pnap | 20K:1 | 20 | 36 | 84.8/15.2 | 166 | 107 |
| S41 | 70/30 | pcy | 20K:1 | 20 | 26.4 | 84.8/15.2 | 270 | 124 |
| S42 | 60/40 | pnap | 20K:1 | none | 17.9 | 81.3/18.7 | 281 | 200 |
| S43 | 60/40 | pcy | 20K:1 | none | 7 | 75.5/24.5 | 387 | 227 |
| S44 | 60/40 | pnap | 20K:1 | 10 | 19.8 | 81.8/18.2 | 196 | 102 |
| S45 | 60/40 | pcy | 20K:1 | 10 | 7.6 | 80.5/19.5 | 350 | 203 |

TABLE 2

| Ex. # | Molar Feed Ratio - DecylNB/CANB/TES NB | Cat. ID | Cat. Conc. | Hexene Conc. | Polymer Yield (%) | Comp. by NMR (DecylNB/CANB/TESNB) | Mw ×10 E-3 | Mn ×10 E-3 |
|---|---|---|---|---|---|---|---|---|
| S46 | 70/20/10 | pnap | 5k | 0 | 82 | 77/16/7 | 733 | 377 |
| S37 | 70/20/10 | pnap | 5k | 5 | 93.1 | 63/20/6.7 | 817 | 429 |
| S48 | 80/10/10 | pnap | 20K | 0 | 86 | 78/14/7 | 515 | 208 |
| S49 | 80/10/10 | pnap | 20K | 10 | 91 | 79/14/7 | 360 | 207 |
| S50 | 80/10/10 | pnap | 20K | 30 | 89 | 80/13/7 | 236 | 104 |

It will be understood from the synthesis example presented above, that it methods have been provided for controlling the molecular weight of polymer embodiments in accordance with the present invention, as well as the refractive index, and through such control of RI, control of the dielectric constant of such polymers. For example, comparing Examples S46 and S47, it is seen that the addition of 1-hexene, other conditions being identical, changes the polymer composition.

Imaging Examples

The following examples demonstrate the imaging of photodefinable compositions in accordance with embodiments of the present invention.

Example I1

BuNB/CANB Copolymer (50/50) was prepared as in Example S2.

7.988 g of the copolymer was dissolved in 18.639 g of mesitylene to obtain a 29.8 wt % polymer solution. 2-(dimethylamino)-1-[4-(4-morpholinyl)phenyl]-2-phenylmethyl)-1-butanone (Irgacure 369, CAS 119313-12-1)(0.05 g, 0.14 mmol) and mesitylene (2.81 g) was added to 12.20 g of the polymer solution. A film was cast on a 4-inch Si wafer coated with 5000 A of a thermally grown silicon oxynitride (SiON) by pouring a 2 mL aliquot of the polymer solution onto the center of the wafer. The wafer was spun at 500 rpm for 10 seconds and then 1000 rpm for 40 seconds on a CEE 100CB spin coater. The film was dried at 120° C. for 5 minutes. The film was exposed to 365 nm UV radiation at a dose of 500 mJ/cm$^2$. The film was further baked at 120° C. for 15 minutes. The pattern was developed by spraying the polymer film with BioAct EC-7R for 60 seconds to dissolve unexposed regions of film to give a standard resolution pattern.

Example I2

An image was patterned in a polymer film as in Example I1 except that the film was exposed to 365 nm UV radiation at a does of 1000 mJ/cm$^2$. A standard resolution pattern for photoresist evaluation was resolved.

Example I3

BuNB/CANB Copolymer (50/50) was prepared as in Example S2.

7.988 g of the copolymer was dissolved in 18.639 g of mesitylene to obtain a 29.8 wt % polymer solution. To 12.20 g of the polymer solution was added phenylbis(2,4,6-trimethylbenzoyl) phosphine oxide photoinitiator (Irgacure 819, CAS 162881-26-7)(0.05 g, 0.12 mmol) and mesitylene (2.80 g).

A film was cast on a 4-inch Si wafer coated with 5000 Å of thermally grown SiON by pouring a 2 mL aliquot of the polymer solution onto the center of the wafer. The wafer was spun at 500 rpm for 10 seconds and then 1000 rpm for 40 seconds on the chuck of CEE 100CB spin coater. The film was dried at 120° C. for 5 minutes. The film was exposed to 365 nm UV radiation at a dose of 500 mJ/cm². The film was further baked at 120° C. for 15 minutes. The pattern was developed spraying the polymer film with Bio-Act EC-7R for 60 seconds to dissolve unexposed regions of film. A standard resolution pattern for photoresist evaluation was resolved.

Example I4

An image was patterned in a polymer film as in Example 13 except that the film was exposed to 365 nm UV radiation at a dose of 1000 mJ/cm². A standard resolution pattern for photoresist evaluation was resolved.

Example I5

An image was patterned in a polymer film as in Example 13 except that the polymer solution contained 1 wt % of Irgacure 819 based on polymer solids content. A standard resolution pattern for photoresist evaluation was resolved.

Example I6

An image was patterned in a polymer film as in Example 15 except that the film was exposed to 365 nm UV radiation at a dose of 1000 mJ/cm². A standard resolution pattern for photoresist evaluation was resolved.

Example I7

BuNB/CANB Copolymer (50/50) was prepared as in Example S2.

7.988 g of the copolymer was dissolved in 18.639 g of mesitylene to obtain a 29.8 wt % polymer solution. To 12.20 g of the polymer solution was added Irgacure 819 (0.05 g, 0.12 mmol) and mesitylene (2.80 g).

A film was cast on a 4-inch Si wafer coated with 8000 Å of thermally grown $SiO_2$ by pouring a 2 mL aliquot of the polymer solution onto the center of the wafer. The wafer was spun at 500 rpm for 10 seconds and then 1500 rpm for 40 seconds on the chuck of CEE 100CB spin coater. The film was dried at 110° C. for 90 seconds. The film was exposed to 365 nm UV radiation at a dose of 500 mJ/cm². The film was further baked in a nitrogen oven at 110° C. for 5 minutes. The pattern was developed by immersion in chloroform for 40 seconds to dissolve unexposed regions of film. A line and space pattern (20×20 μm film thickness measured by profilometer at 5.4 μm) was resolved.

Example I8

DiPhNB/CANB/HxNB polymer (15/20/65) was prepared as in Example S19. 36.90 g of the polymer was dissolved in 118.8 g of mesitylene to obtain a 26.03 wt % polymer solution. 2-benzyl-2-(dimtheylamino)-4'-morpholino-butyrophenone (Irgacure 369, CAS 119313-12-1)(0.156 g, 0.425 mmol) and mesitylene (0.5 g) was added to 33.00 g of the polymer solution. A film was cast on a 4-inch Si wafer coated with 5000 Å of SiON by pouring a 2 mL aliquot of the polymer solution onto the center of the wafer. The wafer was spun at 500 rpm for 10 seconds and then 1000 rpm for 40 seconds on a spin coater. The film was dried at 120° C. for 10 minutes. The film was exposed to 365 nm UV radiation at a dose of 1000 mJ/cm2 through a standard light field/dark field mask. The film was further baked at 120° C. for 15 minutes. The pattern was developed by placing the wafer on the spinner chuck and covering the wafer surface with toluene (8-10 mL) for 60 seconds. The wafer was spun at 3000 rpm for 60 seconds to remove toluene and dry the remaining polymer film. The wafer was rinsed in isopropyl alcohol to remove residual toluene. The remaining polymer film was measured to be 44.0 μm thick.

Example I9

A polymer solution was prepared as in Example 18. A film was cast on a 4-inch Si wafer coated with 5000 Å of SiON by pouring a 2 mL aliquot of the polymer solution onto the center of the wafer. The wafer was spun at 500 rpm for 10 seconds and then 1500 rpm for 40 seconds on a spin coater. The film was dried at 120° C. for 10 minutes. The film was exposed to 365 nm UV radiation at a dose of 500 mJ/cm2 through a lines and spaces pattern mask. The film was further baked at 120° C. for 15 minutes. The pattern was developed placing the wafer on the spinner chuck and covering the wafer surface with mesitylene (8-10 mL) for 60 seconds. The wafer was spun at 3000 rpm for 30 seconds to remove mesitylene and dry the remaining polymer film. The puddle and spin process was repeated a total of 3 times to reach a fully developed pattern. The wafer was heated at 120° C. for 5 minutes to remove residual mesitylene. A series of 25 μm wide lines with a 50 μm pitch was resolved. The remaining polymer film was measured to be 32.57 μm thick.

Example I10

A polymer solution was prepared as in Example 18. A film was cast as in Example 19, except that the polymer film was exposed to 365 nm UV radiation at a dose of 750 mJ/cm2 and the puddle and spin process was repeated a total of 4 times to reach a fully developed pattern. A series of 50 μm wide lines with a 100 μm pitch was resolved. The remaining film was measured to be 32.62 μm thick.

Example I11

A polymer solution was prepared as in Example I8. A film was cast on a 4-inch Si wafer coated with a 75 μm thick layer of a mass polymerization polynorbornene copolymer by pouring a 2 mL aliquot of the polymer solution onto the center of the wafer. The wafer was spun at 500 rpm for 10 seconds and then 1500 rpm for 40 seconds on a spin coater. The film was dried at 120° C. for 10 minutes. The film was exposed to 365 nm UV radiation at a dose of 750 mJ/cm2 through a lines and spaces pattern mask. The film was further baked at 120° C. for 15 minutes. The pattern was developed placing the wafer on the spinner chuck and covering the wafer surface with mesitylene (8-10 mL) for 60 seconds. The wafer was spun at 3000 rpm for 30 seconds to remove mesitylene and dry the remaining polymer film. The puddle and spin process was repeated a total of 4 times to reach a fully developed pattern. The wafer was heated at 120° C. for 5 minutes to remove residual mesitylene. A series of 50 μm wide lines with a 100 μm pitch was resolved. The remaining polymer film was measured to be 32.62 μm thick.

The following examples demonstrate the preparation of clad and core formulations for a waveguide containing the polymer composition in accordance with the present invention.

Examples of Clad Formulations

Example CL1

Component A:

A dry 250 mL Wheaton vial was charged with HxNB (66.87 g, 0.375 mols), TESNB (19.23 g, 0.075 moles), dimethyl bis(norbornene methoxy)silane (SiX) (15.22 g, 0.05 mols) and Pnap (0.035 g, 0.05 mmol)$_2$. The mixture was homogenized until the solid catalyst had dissolved.

Component B:

A dry 250 mL Wheaton vial was charged with HxNB (66.87 g, 0.375 mols), TESNB (19.23 g, 0.075 moles), dimethyl bis(norbornene methoxy)silane (15.22 g, 0.05 mols) and Li FABA (0.088 g, 0.1 mmol). The mixture was homogenized by swirling the vial until the solid co-catalyst had dissolved.

Equal amounts (10 mL) of Component A and Component B were mixed by swirling for 30 seconds in a dry 250 mL vial. The vial was heated at 65° C. in a forced air oven for 6½ minutes. A 4 mL aliquot of the solution was poured onto a 4 inch Si wafer and spun at 100 rpm for 20 seconds and 150 rpm for 20 seconds. The wafer was then heated at 65° C. for 10 minutes and 150° C. for one hour to complete the cure of the clad polymer. The resulting film was approximately 75 μm thick.

Example CL2

Component A:

A clad formulation was prepared as in Example CL2 Component A except that the amount of dimethyl-bis(norbornene methoxy)silane was increased to 21.47 g (0.07 mol).

Component B:

A clad formulation was prepared as in Example CL2 Component B except that the amount of dimethyl-bis(norbornene methoxy)silane was increased to 21.47 g (0.07 mol)

Component A and Component B were mixed and processed as in Example CL2. The resulting film approximately 65 μm thick.

Examples of Core Formulations

Example CO1

CO1 was prepared by utilizing the polymer as prepared in S19.

A photosensitive composition was prepared by adding 7.86 g of polymer, 22.87 g of mesitylene, 2-benzyl-2-(dimethylamino)-4'-morpholinobutyrophenone [Irgacure 369] (0.156 g, 0.425 mMol) and chloroform (0.5 g). The solution was mixed thoroughly by rolling for 18 hours. The resulting polymer solution contains 2 weight % Irgacure 369 photoinitiator based on polymer solids content.

Example CO2

CO2 was prepared by utilizing the polymer as prepared in S19.

A photosensitive composition was prepared by adding 19.71 g of polymer, 63.34 g of mesitylene, 2 phenylbis(2, 4,6-trimethylbenzoyl) phosphine oxide [Irgacure 819] (0.395 mg, 1.08 mMol). The solution was mixed thoroughly by rolling for 18 hours. The resulting polymer solution contains 2 weight % Irgacure 819 photoinitiator based on polymer solids content.

Wafer Preparation

The following examples demonstrate the preparation of a wafer encompassing the clad and core compositions containing the polymer composition in accordance with the present invention.

Example W1

Formation of Clad Polymer

A 4 inch silicon wafer coated with 8000 Å of thermally grown SiO2 was mounted on the chuck of a spin coater. The surface of wafer was coated with an ethanol solution containing 3 wt. % 6-azido-sulphonylhexyl triethoxysilane and held at 0 rpm for 30 seconds. The wafer was then spun at 3000 rpm to eliminate excess ethanol solution, followed by drying at 85° C. for 2 minutes. A 2.5 mL aliquot of Component A from CL1 was transferred into a dry 2 oz. AC wide mouth bottle. A 2.5 mL aliquot of Component from CL1 was added to the solution and mixed by swirling for 30 seconds to allow an active polymerization catalyst to form. The vial was placed in a forced air oven set at 65° C. and heated for 7 minutes in order to allow the solution viscosity to increase as the polymerization catalyst began to convert monomer to polymer. After removal from the oven, a 3 mL aliquot of the viscous solution was immediately poured onto a primed SiO$_2$ wafer and the wafer was spun for 100 rpm for ten seconds and 150 rpm for twenty seconds in order to uniformly coat the wafer with the polymer. The wafer was then heated in a forced air oven at 65° C. for ten minutes and 150° C. for one hour to complete the cure of the clad polymer. The clad layer was measured at 60 microns thick.

Example W2

Formation of Clad Polymer

A clad polymer was prepared as in W1 except that Component A and Component B from CL2 were utilized. The clad layer formed was measured at 60 microns thick.

Example W3

Imaging of CO1 on CL1

A wafer was prepared by coating with the clad polymer from CL1 above and then mounted on the chuck of a spin coater. A 2 mL aliquot of CO1 was poured onto the center of the wafer. The wafer was spun at 500 rpm for 10 seconds and then 1500 rpm for 40 seconds. The wafer was dried at 120° C. for 10 minutes. The wafer was exposed to 365 nm UV radiation at a dose of 500 mJ/cm$^2$ through a lines and spaces pattern mask. The wafer was further baked at 120° C. for 20 minutes to advance the crosslinking reaction in the exposed film. The pattern was developed by placing the wafer on the spinner chuck and covering the wafer surface with mesitylene (10 mL) for 30 seconds. The wafer was sprayed with mesitylene for 10 seconds as the spinner accelerated to 3000 rpm for 60 seconds to remove the mesitylene and dry the remaining polymer film. The wafer was rinsed in isopropyl alcohol for 15 seconds to remove traces of residual mesitylene. A second puddle/spray/rinse cycle was required to fully develop the pattern in the core layer. The resulting core structures were found to be 32 microns thick.

Example W4

Imaging of CO1 and CL2

A wafer was prepared by coating with the clad polymer as in CL2 above and then mounted on the chuck of a spin coater. A 2 mL aliquot of CO1 was poured onto the center of the wafer. The wafer was spun at 500 rpm for 10 seconds and then 1500 rpm for 40 seconds. The wafer was dried at 115° C. for 10 minutes. The wafer was exposed to 365 nm UV radiation at a dose of 750 mJ/cm$^2$ through a lines and spaces pattern mask. The wafer was further baked for 15 minutes to advance the crosslinking reaction in the exposed film. The pattern was developed by placing the wafer on the spinner chuck and covering the wafer surface with mesitylene (10 mL) for 30 seconds. The wafer was sprayed with mesitylene for 10 seconds as the spinner accelerated to 3000 rpm and then spun for 50 seconds to remove the mesitylene and dry the remaining polymer film. The puddle/develop step was repeated a total of 3 times. The wafer was rinsed with isopropyl alcohol for 15 seconds to remove residual mesitylene.

Example W5

Imaging of $CO_2$

A wafer prepared as in W2 was mounted on the chuck of a spin coater. A 2 mL aliquot of $CO_2$ was poured onto the center of the wafer. The wafer was spun at 500 rpm for 10 seconds and then 1000 rpm for 40 seconds. The wafer dried at 110° C. and the tacky polymer film was dried by baking for 10 minutes. The wafer was exposed to 365 nm UV radiation at a dose of 400 mJ/cm$^2$ through a lines and spaces pattern mask. The wafer was further baked at 110° C. for 15 minutes to advance the crosslinking reaction in the exposed film. The pattern was developed by placing the wafer on the spinner chuck and covering the wafer surface with toluene (10 mL) for 30 seconds. The wafer was sprayed with toluene for 10 seconds as the spinner accelerated to 3000 rpm and then spun for 60 seconds to remove the toluene and dry the remaining polymer film. The wafer was rinsed with isopropyl alcohol for 15 seconds to remove residual toluene.

Example W6

Imaging of CO2

A wafer was prepared and processed as in W5 except that the wafer was developed utilizing mesitylene (10 mL).

Example W7

Imaging of CO2 on CL1

A wafer was prepared as in W1 and mounted on the chuck of a spin coater. A 2 mL aliquot of $CO_2$ was poured onto the center of the wafer. The wafer was spun at 500 rpm for 10 seconds and then 1000 rpm for 40 seconds. The wafer was dried at 110 C for 10 minutes. The wafer was exposed to 365 nm UV at a dose of 750 mJ/cm$^2$ radiation through a lines and spaces pattern mask. The wafer was then further baked in a nitrogen oven at 115° C. on a teflon coated metal plate for 15 minutes to advance the crosslinking reaction in the exposed film. The pattern was developed by placing the wafer on the spinner chuck and covering the wafer surface with toluene (10 mL) for 30 seconds. The wafer was sprayed with toluene for 10 seconds as the spinner accelerated to 3000 rpm and then spun for 60 seconds to remove the toluene and dry the remaining polymer film. The wafer was rinsed with isopropyl alcohol for 15 seconds to remove traces of residual toluene.

Example W8

Imaging of CO2 on CL2

A wafer was prepared as in W2 above and mounted on the chuck of a spin coater. A 2 mL aliquot of the core polymer solution B was poured from the 50 mL amber bottle onto the center of the wafer. The wafer was spun at 500 rpm for 10 seconds and then 1500 rpm for 40 seconds. The wafer was transferred to a hot plate set at 115° C. and the tacky polymer film was dried by baking for 10 minutes. The wafer was transferred to an AB-M mask aligner and exposed to 750 mJ/cm$^2$ of 365 nm UV radiation through lines and spaces pattern mask. The wafer was then placed on a hot plate set at 115° C. and baked for 15 minutes to advance the crosslinking reaction in the exposed film. The pattern was developed by placing the wafer on the spinner chuck and covering the wafer surface with toluene (10 mL) for 30 seconds. The wafer was sprayed with toluene for 10 seconds as the spinner accelerated to 3000 rpm for the drying step. The wafer was then spun at 3000 rpm for 50 seconds to remove the toluene and dry the remaining polymer film. The puddle develop step was repeated a total of 3 times. The wafer was rinsed with isopropyl alcohol for 15 seconds to remove traces of residual toluene.

While the invention has been explained in relation to various embodiments, it is to be understood that various modifications thereof will become apparent to those skilled in the art upon reading the specification. Therefore, it is to be understood that the invention disclosed herein is intended to cover such modifications as fall within the scope and spirit of the claims presented below.

What is claimed is:

1. A directly photodefinable polymer composition (DPPC) comprising:
    a polymer comprising a first norbornene-type repeat unit having a pendant silyl group and a second norbornene-type repeat unit having a pendant acrylate-type group, represented by the structure below:

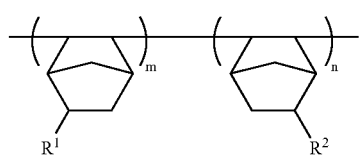

where n and m are independently each an integer from 1 to 5000, one of $R^1$ and $R^2$ is an acrylate-type group and the other is a silyl group;
a solvent; and
a photoinitiator.

2. The polymer of claim 1, where the second norbornene-type repeat unit is derived from a norbornene-type monomer represented by:

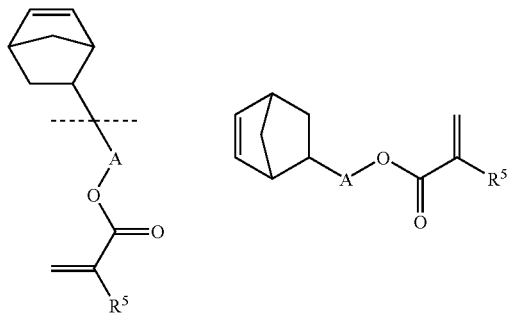

where $R^5$ represents hydrogen, a linear or branched $C_1$-$C_4$ hydrocarbon, a nitrile (CN), a $C_1$-$C_3$ perfluorocarbon, an aromatic, or a halogen (F, Cl, Br), A represents a $C_1$-$C_3$ alkyl or $(CH_2)_q$—$(CR^eR^f)$—O—$(CH_2)_q$— where q independently represents an integer from 0 to 3 and $R^e$ and $R^f$ represent hydrogen, a $C_1$-$C_5$ alkyl, or a $C_1$-$C_3$ perfluorocarbon.

3. The polymer of claim 2, where the first norbornene-type repeat unit is derived from a norbornene-type monomer represented by:

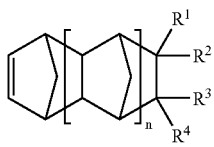

where n is 0, $R^1$, $R^2$, $R^3$ and $R^4$ independently represent hydrogen and where one of $R^1$-$R^4$ is —$(CH_2)_x$—Si$(R^aR^bR^c)_3$, where x is an integer from 0 to 6, and $R^a$, $R^b$ and $R^c$ are, in any combination, independently a $C_1$-$C_4$ alkyl, a $C_1$-$C_4$ alkoxy or a halogen.

4. The polymer of claim 2, where the first norbornene-type repeat unit is derived from a norbornene-type monomer represented by:

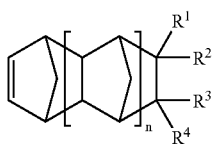

where n is 0, $R^1$, $R^2$, $R^3$ and $R^4$ independently represent hydrogen and where one of $R^1$-$R^4$ is —$(CH_2)_x$—Si$(R^aR^bR^c)_3$, where x is an integer from 0 to 6, and each of $R^a$, $R^b$, and $R^c$ are the same and are selected from methoxy, ethoxy, propoxy, butoxy, pentoxy groups and chlorine.

5. The polymer of claim 2, where the first norbornene-type repeat unit is derived from a norbornene-type monomer selected from the group of POSS NB monomers consisting of 1020NB, 1021NB, 1022NB, 1034NB, 1035NB and 1038NB.

6. The polymer of claim 1, further comprising a third norbornene-type repeat unit, such repeat unit represented by:

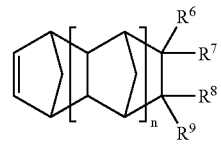

where n is an integer from 0 to 5, $R^6$ to $R^9$ independently represent hydrogen, a hydrocarbyl or a functional substituent; where the hydrocarbyl is a linear or branched $(C_1$-$C_{10})$ alkyl, a linear or branched $(C_2$-$C_{10})$ alkenyl, a linear or branched $(C_2$-$C_{10})$ alkynyl, a linear or branched $(C_5$-$C_{12})$ cycloalkyl, a $(C_6$-$C_{18})$ aryl, or a $(C_7$-$C_{24})$ aralkyl, or where one of $R^6$ or $R^7$ taken together with one of $R^8$ or $R^9$ and with the two ring carbon atoms to which they are attached represents a saturated or unsaturated $C_5$-$C_{12}$ cyclic group containing or a $C_6$-$C_{14}$ aryl group; and where the functional substituent is independently a radical selected from —$(CH_2)_m$—$CH(CF_3)_2$—O—$CH_2$—O—$CH_3$, $(CH_2)_m$—$CH(CF_3)_2$—O—$C(O)$—O—$C(CH_3)_3$, —$(CH_2)_m$—$C(CF_3)_2$—OH, $(CH_2)_m$—$C(O)NH_2$, $(CH_2)_m$—$C(O)Cl$, —$(CH_2)_m$—$C(O)OR^*$, $(CH_2)_m$—$OR^*$, —$(CH_2)_m$—$OC(O)R^*$, and —$(CH_2)_m$—$C(O)R^*$, where m independently represents an integer from 0 to 10 and $R^*$ independently represents hydrogen or a hydrocarbyl, as defined above.

7. The polymer of claim 6, where the second norbornene-type repeat unit is derived from a norbornene-type monomer represented by:

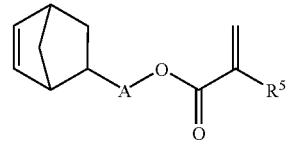

where $R^5$ represents hydrogen, a linear or branched $C_1$-$C_4$ hydrocarbon, a nitrile (CN), a $C_1$-$C_3$ perfluorocarbon, an aromatic, or a halogen (F, Cl, Br), A represents a $C_1$-$C_3$ alkyl or $(CH_2)_q$—$(CR^eR^f)$—O—$(CH_2)_q$— where q independently represents an integer from 0 to 3 and $R^e$ and $R^f$ represent hydrogen, a $C_1$-$C_5$ alkyl, or a $C_1$-$C_3$ perfluorocarbon;

the first norbornene-type repeat unit is derived from a norbornene-type monomer selected from the group of POSS NB monomers 1020NB, 1021NB, 1022NB, 1034NB, 1035NB and 1038NB, or the third norbornene-type repeat unit is derived from a norbornene-type monomer represented by:

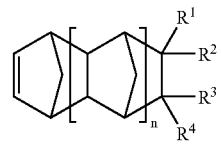

where n is 0, one of $R^1$, $R^2$, $R^3$ and $R^4$ —$(CH_2)_x$—Si$(R^a R^b R^c)_3$, where x is an integer from 0 to 6, and the others of $R^1$-$R^4$ independently represent hydrogen, and where $R^a$, $R^b$ and $R^c$ are either independently selected from a $C_1$-$C_4$ alkyl, a $C_1$-$C_4$ alkoxy and a halogen, in any combination, or each of Ra, Rb, and Rc are the same and are selected from methoxy, ethoxy, propoxy, butoxy, pentoxy groups and chlorine.

* * * * *